(12) United States Patent
Azin et al.

(10) Patent No.: US 11,546,004 B2
(45) Date of Patent: Jan. 3, 2023

(54) TRANSMITTER OUTPUT SIGNAL POWER MEASUREMENT APPARATUS

(71) Applicant: QUALCOMM Incorporated, San Diego, CA (US)

(72) Inventors: Meysam Azin, San Diego, CA (US); Li Lu, San Diego, CA (US); Anees Habib, Mountain View, CA (US); Chinmaya Mishra, San Diego, CA (US); Damin Cao, San Diego, CA (US); Arul Balasubramaniyan, Plano, TX (US); David Ta-hsiang Lin, San Diego, CA (US); Shuang Zhu, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/211,769

(22) Filed: Mar. 24, 2021

(65) Prior Publication Data

US 2022/0311460 A1    Sep. 29, 2022

(51) Int. Cl.
*H04B 1/04*    (2006.01)
*H03M 3/00*    (2006.01)
*H03M 1/46*    (2006.01)

(52) U.S. Cl.
CPC ............. *H04B 1/04* (2013.01); *H03M 1/462* (2013.01); *H03M 3/458* (2013.01); *H04B 2001/045* (2013.01)

(58) Field of Classification Search
CPC .. H01Q 3/24; H01Q 3/26; H01Q 3/30; H03M 1/462; H03M 3/00; H03M 3/322;
(Continued)

(56) References Cited

U.S. PATENT DOCUMENTS 6,977,502 B1 * 12/2005  Hertz ................. G01R 33/3621
                                                                324/318
10,270,510 B1    4/2019  Wang et al.
(Continued)

FOREIGN PATENT DOCUMENTS

WO         02084935 A1    10/2002

OTHER PUBLICATIONS

International Search Report and Written Opinion—PCT/US2022/019353—ISA/EPO—dated Jul. 5, 2022.

*Primary Examiner* — Shawkat M Ali
(74) *Attorney, Agent, or Firm* — Loza & Loza, LLP

(57) ABSTRACT

Aspects of the disclosure relate to an apparatus for wireless communication. The apparatus may include a set of power detectors configured to generate a set of analog signals related to a set of output signal power levels of a set of transmit chains of a transmitter, respectively; an analog summer; a set of switching devices configured to send a selected one or more of the set of analog signals to the analog summer, and substantially isolated unselected one or more of the set of power detectors from the analog summer, wherein the analog summer is configured to generate a cumulative analog signal based on a sum of the selected one or more of the set of analog signals; an analog-to-digital converter (ADC) configured to generate a digital signal based on the cumulative analog signal; and a controller configured to control the set of switching devices.

30 Claims, 7 Drawing Sheets

(58) Field of Classification Search
CPC .......... H03M 3/458; H04B 1/00; H04B 1/04; H04B 1/69; H04B 7/10; H04B 17/10; H04B 17/12
USPC ....... 375/140, 219, 260, 267, 295–297, 343; 341/110, 143, 155, 200
See application file for complete search history.

(56) References Cited

U.S. PATENT DOCUMENTS

| | | | |
|---|---|---|---|
| 2007/0004351 A1* | 1/2007 | Dekker | H04L 27/2626 455/127.1 |
| 2011/0051782 A1* | 3/2011 | Gupta | H03H 11/12 375/140 |
| 2016/0372828 A1* | 12/2016 | Geis | H04B 17/14 |
| 2016/0380652 A1 | 12/2016 | Anthony et al. | |
| 2017/0294951 A1 | 10/2017 | Weissman et al. | |
| 2021/0075449 A1 | 3/2021 | Lee et al. | |

\* cited by examiner

TRANSMITTER OUTPUT SIGNAL POWER MEASUREMENT APPARATUS

FIELD

Aspects of the present disclosure relate generally to wireless communication devices, and in particular, to a transmitter output signal power measurement apparatus.

BACKGROUND

A wireless communication device typically includes a transceiver or transmitter for transmitting a radio frequency (RF) signal to another wireless communication device, such as a base station (BS) or user equipment (UE). For improved transmission gain (as well as receive gain), the transceiver or transmitter is configured with a set of transmit chains coupled to a set of antennas (e.g., an antenna array), respectively. The transmit chains may be configured to achieve beamforming by the antenna array such that the transmission gain in a particular direction is significantly increased, and in other directions are significantly reduced. The direction to which the gain is maximized points substantially to a destination wireless communication device for the transmitted RF signal.

Each of the transmit chain includes a power amplifier (PA) to amplify the power of the transmit signal so that the destination device is able to successfully receive and process the signal. However, the power of the transmit signal at the output of the PA should be below some limit to prevent damage to the PA. Further, there are governmental or other type of regulations that restrict the total output signal power of the transmitter for safety and interference control purposes. Thus, for PA protection and meeting regulatory requirements, the output signal power of a transmitter should be measured and controlled.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a set of power detectors coupled to a set of transmit chains of a transmitter, respectively; an analog summer; a first set of switching devices coupled between the set of power detectors and an input of the analog summer, respectively; and an analog-to-digital converter (ADC) including an input coupled to an output of the analog summer, and an output configured to produce a first digital signal related to an output power of the transmitter.

Another aspect of the disclosure relates to an apparatus. The apparatus includes a set of power detectors configured to generate a set of analog signals related to a set of output signal power levels of a set of transmit chains of a transmitter, respectively; an analog summer; a first set of switching devices configured to send a selected one or more of the set of analog signals to the analog summer and substantially isolated unselected one or more of the set of power detectors from the analog summer, wherein the analog summer is configured to generate a cumulative analog signal based on a sum of the selected one or more of the set of analog signals; an analog-to-digital converter (ADC) configured to generate a first digital signal based on the cumulative analog signal; and a controller configured to control the first set of switching devices.

Another aspect of the disclosure relates to a method. The method includes generating a set of analog signals related to a set of output signal power levels of a set of transmit chains of a transmitter, respectively; summing a selected one or more of the set of analog signal to generate a cumulative analog signal; and digitizing the cumulative analog signal to generate a digital signal.

Another aspect of the disclosure relates to an apparatus. The apparatus includes means for generating a set of analog signals related to a set of output signal power levels of a set of transmit chains of a transmitter, respectively; means for summing a selected one or more of the set of analog signal to generate a cumulative analog signal; and means for digitizing the cumulative analog signal to generate a digital signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
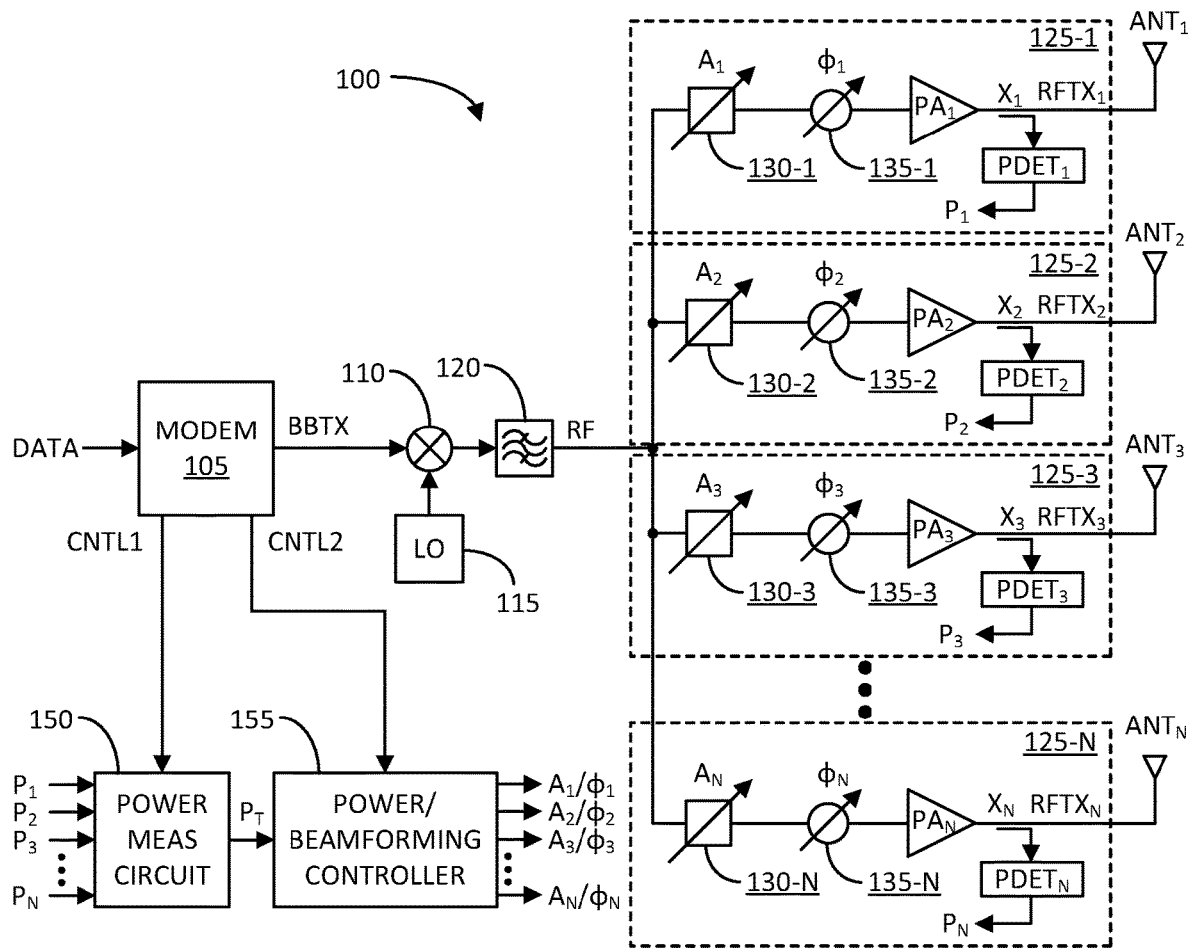
FIG. 1 illustrates a block diagram of an example transmitter of a wireless communication device in accordance with an aspect of the disclosure.

FIG. 1 illustrates a block diagram of an example transmitter 100 of a wireless communication device in accordance with an aspect of the disclosure. The transmitter 100 includes a modulator-demodulator (modem) 105, a mixer 110, a local oscillator (LO) 115, a radio frequency (RF) filter 120, a set of transmit chains 125-1 to 125-N, and a set of antennas $ANT_1$ to $ANT_N$ configured as an antenna array. The transmitter 100 further includes a power measurement circuit 150 and a power/beamforming controller 155. The set of transmit chains 125-1 to 125-N include a set of pre-amplifiers 130-1 to 130-N, a set of phase shifters 135-1 to 135-N, a set of power amplifiers $PA_1$ to $PA_N$, a set of couplers $X_1$ to $X_N$, and a set of power detectors $PDET_1$ to $PDET_N$, respectively. It shall be understood that the configuration or architecture of each of the transmit chains 125-1 to 125-N may vary (e.g., the phase detector may be in a different location in other configurations of the transmit chains 125-1 to 125-N), but should include or be coupled to a power detector for the concepts described herein.

Data to be transmitted to a destination wireless communication device is applied to the modem 105. The modem 105 processes the data (e.g., error correction encodes the data, scrambles the data, quadrature modulates the encoded and/or scrambled data to generate symbols, Inverse Fast Fourier Transform (IFFT) the symbols to generate an orthogonal frequency division multiplexing (OFDM) signal, and converts the OFDM signal into an analog signal, etc.) to generate a baseband transmit signal BBTX. The mixer 110 mixes the baseband transmit signal BBTX with an LO signal generated by the LO 115 to generate a mixed signal. The RF filter 120 filters the mixed signal to substantially remove lower frequency components of the mixed signal to generate an RF signal. The RF signal is applied to inputs of the set of transmit chains 125-1 to 125-N.

Although in this example, the baseband transmit signal BBTX is converted directly into an RF signal via the mixer 110, LO 115, and RF filter 120, it shall be understood that the transceiver may perform multiple frequency up-conversions, such as one conversion from baseband (BB) to intermediate frequency (IF), and another conversion from IF to RF. Further, the modem 105, power measurement circuit 150, and power/beamforming controller 155 may be part of baseband chip or IC, and the up-conversion circuitry (e.g., mixer 110, LO 115, and RF filter 120) and the set of transmit chains 125-1 to 125-N may be separate from the baseband chip or IC. The configuration and architecture of the baseband portion and IF/RF portion of the transmitter 100 may vary significantly.

Based on whether the RF signal is to be transmitted omni-directionally or directionally, one or more of the set of transmit chains 125-1 to 125-N may pre-amplify, phase-shift, and power amplify the RF signal. For example, the set of pre-amplifiers 130-1 to 130-N are configured to amplify the RF signal with gains $A_1$ to $A_N$, respectively. The set of phase shifters 135-1 to 135-N are configured to phase shift the pre-amplified RF signals by phase shifts $\phi_1$ to $\phi_N$, respectively. The power amplifiers $PA_1$ to $PA_N$ are configured to power amplify the pre-amplified and phase-shifted RF signals to generate a set of RF transmit signals $RFTX_1$ to $RFTX_N$, respectively. The RF transmit signals $RFTX_1$ to $RFTX_N$ are provided to the set of antennas $ANT_1$ to $ANT_N$ (e.g., antenna array) for wireless transmission to one or more destination wireless communication devices, respectively.

For transmitter output signal power measurement detection and control, the set of power detectors $PDET_1$ to $PDET_N$ receive samples of the set of RF transmit signals $RFTX_1$ to $RFTX_N$ via the set of couplers $X_1$ to $X_N$, respectively. The set of power detectors $PDET_1$ to $PDET_N$ rectify and filters the sampled RF transmit signals $RFTX_1$ to $RFTX_N$ to generate a set of analog signals $P_1$ to $P_N$, respectively. The set of analog signals $P_1$ to $P_N$, which could be voltages or currents, are related to the power levels of the RF transmit signals $RFTX_1$ to $RFTX_N$ at the outputs of the set of transmit chains 125-1 to 125-N, respectively. The set of analog signals $P_1$ to $P_N$ are provided to the power measurement circuit 150.

Based on a control signal CNTL1 (e.g., codebook) from the modem 105, the power measurement circuit 150 processes the set of analog signals $P_1$ to $P_N$ to generate a detected power signal PT indicative of or related to the total output signal power of the transmitter 100. For example, the detected power signal PT may be substantially related to the sum of one or more selected analog signals $P_1$ to $P_N$ averaged over a programmable time interval, and corrected for offsets (e.g., direct current (DC) voltage or current offsets) in the set of analog signals $P_1$ to $P_N$ due to non-ideal operation or process imperfections in the set of power detectors $PDET_1$ to $PDET_N$, as well as for any non-linearity of the power measurement circuit 150, as discussed further herein.

Based on another control signal CNTL2 from the modem 105, the power/beamforming controller 155 receives and processes the detected power signal PT to control the gains $A_1$ to $A_N$ of the set of pre-amplifiers 130-1 to 130-N and the phase shifts $\phi_1$ to $\phi_N$ of the set of phase shifters 135-1 to 135-N, respectively. This is done to control the total output signal power of the transmitter 100 so as to prevent damage to the power amplifiers $PA_1$ to $PA_N$, as well as comply with governmental or other regulatory requirements. Additionally, in the case of a directional transmission, the power/beamforming controller 155 sets the gains $A_1$ to $A_N$ of the set of pre-amplifiers 130-1 to 130-N and the phase shifts $\phi_1$ to $\phi_N$ of the set of phase shifters 135-1 to 135-N to beamform the radiation pattern produced the antenna array $ANT_1$ to $ANT_N$ such that the gain in a particular direction (e.g., towards a destination wireless communication device) is substantially maximized or greater as compared to other directions.

Figure 2:
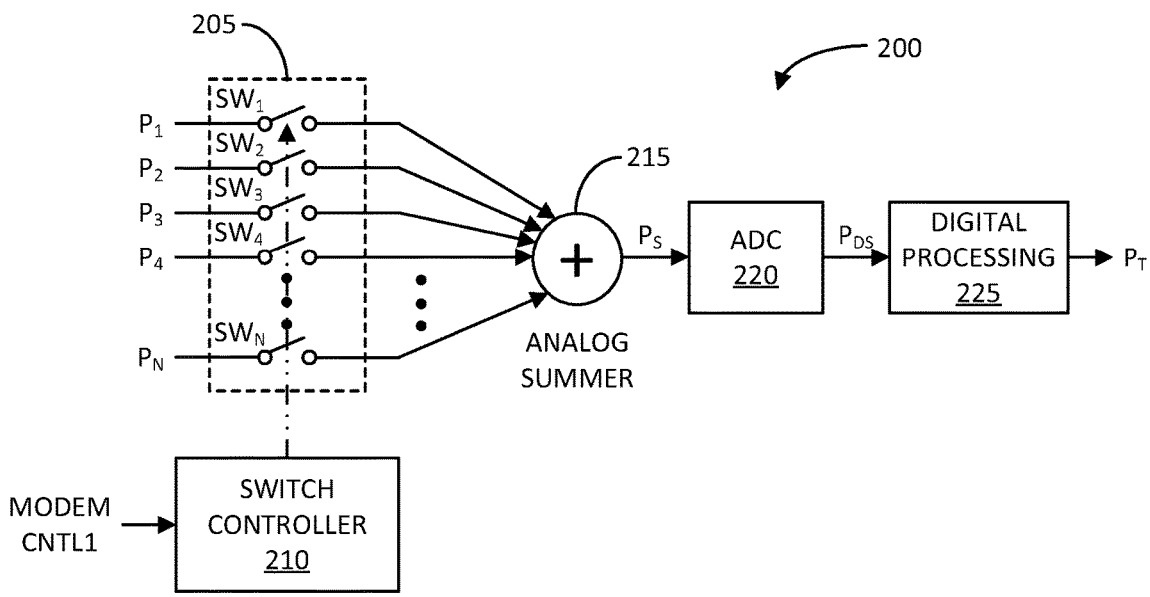
FIG. 2 illustrates a block/schematic diagram of an example transmitter output signal power measurement circuit in accordance with another aspect of the disclosure.

FIG. 2 illustrates a diagram of an example transmitter output power measurement circuit 200 in accordance with another aspect of the disclosure. The power measurement circuit 200 may be an example detailed implementation of the power measurement circuit 150 previous discussed. In particular, the power measurement circuit 200 includes a switch network 205 including a set of switching devices $SW_1$ to $SW_N$, an analog summer 215, an analog-to-digital converter (ADC) 220, and a digital processing circuit 225. The power measurement circuit 200 may further include a switch controller 210 coupled to the set of switching devices $SW_1$ to $SW_N$ to control their respective open/closed states.

The set of switching devices $SW_1$ to $SW_N$ of the switch network 205 is coupled between the set of power detectors $PDET_1$ to $PDET_N$ and an input(s) of the analog summer 215. More specifically, the set of switching devices $SW_1$ to $SW_N$ includes a first set of terminals coupled to the set of power detectors $PDET_1$ to $PDET_N$ to receive the set of analog signals $P_1$ to $P_N$ therefrom, respectively. The set of switching devices $SW_1$ to $SW_N$ includes a second set of terminals coupled to an input or a set of inputs of the analog summer 215. The set of switching devices $SW_1$ to $SW_N$ includes a set of control inputs coupled to the switch controller 210 to receive control signals therefrom to control their respective open/closed states. The switch controller 210, in turn, may be coupled to the modem 105 to receive the control signal CNTL1 that governs the time at which one or more selected switching devices $SW_1$ to $SW_N$ are closed (and one or more unselected switching devices are open).

As an example of a power measurement mode operation, based on a current transmission profile as set by the modem 105, the transmit chains 125-2 and 125-3 are active to generate RF transmit signals $RFTX_2$ and $RFTX_3$ based on the RF signal from the RF filter 120, respectively; while the other transmit chains 125-1 and 125-4 to 125-N are inactive. In other words, power measurement channels 2-3 are active and channels 1 and 4-N are inactive. Accordingly, in response to the control signal CNTL1 from the modem 105, the switch controller 210 closes switching devices $SW_2$-$SW_3$, and opens switching devices $SW_1$ to $SW_4$ to $SW_N$. The closing of switching devices $SW_2$-$SW_3$ sends the analog signals $P_2$ and $P_3$ from the power detectors $PDET_2$ and $PDET_3$ to the input(s) of the analog summer 215. The opening of switching devices $SW_1$ to $SW_4$ to $SW_N$ substantially isolates the power detectors $PDET_1$ and $PDET_4$ to $PDET_N$ of the unselected channels from the analog summer 215 to prevent noise and/or transmit power leakage (e.g., via antenna-to-antenna coupling and/or transmit chain-to-transmit chain coupling) from being applied to the input(s) of the analog summer 215.

The analog summer 215 sums the one or more selected analog signals $P_1$ to $P_N$ it receives from the switch network 205 to generate a cumulative analog signal $P_S$ being related to the sum of the analog signal it receives. In the example above, the analog summer 215 receives analog signals $P_2$ and $P_3$ from the switch network 205, and generates the cumulative analog signal $P_S$ based on a sum of the analog signals $P_2$ and $P_3$. Accordingly, the cumulative analog signal $P_S$ is an indication of or related to the output signal power of the transmitter 100.

The ADC 220 converts the cumulative analog signal $P_S$ into a digital signal $P_{DS}$. The digital processing circuit 225 may perform various digital processing operations, such as decimating/averaging the digital signal $P_{DS}$ over a programmable time interval (e.g., one or more OFDM symbol intervals of the transmit signal), and correct or modify the decimated/averaged digital signal for offsets produced by the set of power detectors $PDET_1$ to $PDET_N$. The set of power detectors $PDET_1$ to $PDET_N$ may generate a set of offsets when the transmitter 100 is not transmitting due to process imperfections in the power detectors. Such offsets may vary with temperature. If not corrected, the offsets may be interpreted as transmit power, which results in error in the resulting detected power signal $P_T$. The digital processing circuit 225 may also correct for any non-linearity in the analog summer 215, which may also produce errors in the resulting detected power signal $P_T$.

In offset calibration mode, the transmitter 100 does not transmit a signal. As discussed further herein, the transmitter 100 does not transmit a signal during a time interval (often referred to as an R2T time interval) between a receive time interval and a following transmit time interval. In calibration mode, the switch controller 210 closes the switching device associated with the power detector whose offset is to be measured for use in power measurement mode, and opens the remaining switching devices. The measurements of the offsets associated with the power detectors $PDET_1$ to $PDET_N$ may be measured in a time-multiplexed manner.

For example, if the offset associated with power detector $PDET_1$ is to be measured, the switch controller 210 closes switching device $SW_1$ and opens switching devices $SW_2$ to $SW_N$. The closed switching device $SW_1$ sends the offset to the analog summer 215 which, in turn, sends the offset to the ADC 220. The ADC 220 digitizes the offset and sends it to the digital processing circuit 225, which stores it in memory, and subsequently uses it to correct an intermediate detected power signal PINT to generate the detected power signal $P_T$. The offsets associated with the other power detectors $PDET_2$ to $PDET_N$ are measured in similar manner, where the memory of the digital processing circuit 225 stores the offsets associated with the set of power detectors $PDET_2$ to $PDET_N$, respectively. As mentioned above, the offsets of the power detectors may be measured during each R2T time interval.

Figure 3:
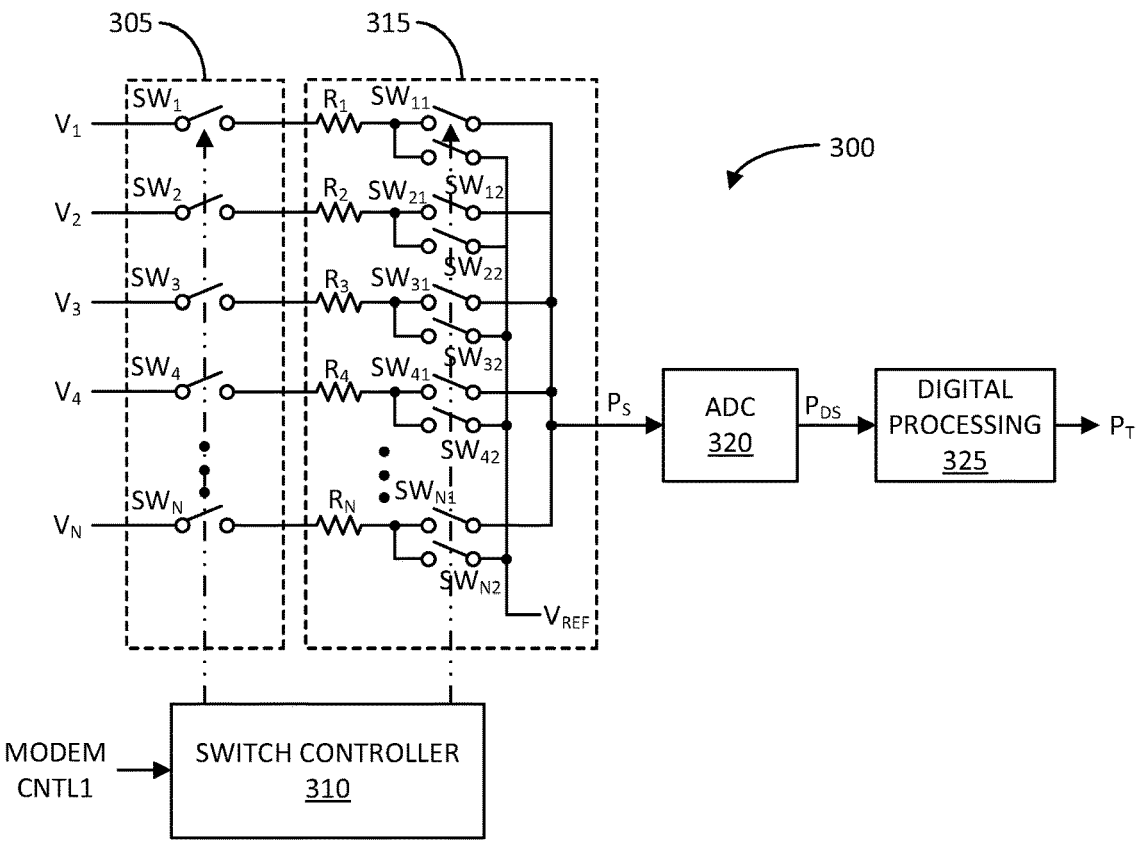
FIG. 3 illustrates a block/schematic diagram of another example transmitter output signal power measurement circuit in accordance with another aspect of the disclosure.

FIG. 3 illustrates a block/schematic diagram of another example transmitter output power measurement circuit 300 in accordance with another aspect of the disclosure. The power measurement circuit 300 may be another example detailed implementation of the power measurement circuit 150 previous discussed. In this example, the set of analog signals $P_1$ to $P_N$ generated by the set of power detectors $PDET_1$ to $PDET_N$ is a set of voltages $V_1$ to $V_N$, respectively. Thus, as discussed further herein, the analog summer in power measurement circuit 300 may be a passive voltage summer. However, it shall be understood that the analog summer may be an active analog summer, such as a switch-capacitor based summer. Moreover, the analog summer may also be configured as a current summer if the power detectors are configured to output currents rather than voltages.

In particular, the power measurement circuit 300 includes a switch network 305 including a set of switching devices $SW_1$ to $SW_N$, an analog summer 315, an analog-to-digital converter (ADC) 320, and a digital processing circuit 325. The power measurement circuit 300 may further include a switch controller 310 coupled to the set of switching devices $SW_1$ to $SW_N$ to control their respective open/closed states.

The set of switching devices $SW_1$ to $SW_N$ of the switch network 305 is coupled between the set of power detectors $PDET_1$ to $PDET_N$ and a set of inputs of the analog summer 315, respectively. More specifically, the set of switching devices $SW_1$ to $SW_N$ includes a first set of terminals coupled to the set of power detectors $PDET_1$ to $PDET_N$ to receive the set of voltages $V_1$ to $V_N$ therefrom, respectively. The set of switching devices $SW_1$ to $SW_N$ includes a second set of terminals coupled to a set of inputs of the analog summer 315, respectively. The set of switching devices $SW_1$ to $SW_N$ includes a set of control inputs coupled to the switch controller 310 to receive control signals therefrom to control their respective open/closed states, respectively. The switch controller 310, in turn, may be coupled to the modem 105 to receive the control signal CNTL1 that governs the time at which one or more selected switching devices $SW_1$ to $SW_N$ are closed (and one or more unselected switching devices are open).

The analog summer 315 includes a set of resistors $R_1$ to $R_N$, a first set of switching devices $SW_{11}$ to $SW_{N1}$, and a second set of switching devices $SW_{12}$ to $SW_{N2}$. The set of resistors $R_1$ to $R_N$ is coupled between the first set of switching devices SW1 to SWN of the switch network 305, respectively. The first set of switching devices $SW_{11}$ to $SW_{N1}$ is coupled between the set of resistors $R_1$ to $R_N$ and an input of the ADC 320, respectively. The second set of switching devices $SW_{12}$ to $SW_{N2}$ is coupled between the set of resistors $R_1$ to $R_N$ and a reference voltage source VREF, respectively. The first and second sets of switching devices $SW_{11}$ to $SW_{N1}$ and $SW_{12}$ to $SW_{N2}$ include a set of control inputs coupled to the switch controller 310 to receive control signals therefrom to control their respective open/closed states.

Considering the same power measurement mode example discussed above, based on a current transmission profile as set by the modem 105, the transmit chains 125-2 and 125-3 are active to generate RF transmit signals $RFTX_2$ and $RFTX_3$ based on the RF signal from the RF filter 120, respectively; while the other transmit chains 125-1 and 125-4 to 125-N are inactive (e.g., channels 2-3 are active, and channels 1 and 4-N are inactive). Accordingly, in response to the control signal CNTL1 from the modem 105, the switch controller 310 closes switching devices $SW_2$-$SW_3$ and opens the switching devices $SW_1$ to $SW_4$ to $SW_N$ of the switch network 305. The closing of switching devices $SW_2$-$SW_3$ sends the voltages $V_2$ and $V_3$ from the power detectors $PDET_2$ and $PDET_3$ to the resistors $R_2$ and $R_3$ of the analog summer 315. The opening of switching devices $SW_1$ to $SW_4$ to $SW_N$ substantially isolates the analog summer 315 from the power detectors $PDET_1$ and $PDET_4$ to $PDET_N$ associated with the unselected channels to prevent noise and/or transmit power leakage (e.g., via antenna-to-antenna coupling and/or transmit chain-to-transmit chain coupling) from being applied to the inputs of the analog summer 315.

Further, in response to the control signal CNTL1, the switch controller 310 closes switching devices $SW_{21}$ and $SW_{31}$ (active channels) and opens switching devices $SW_{11}$ and $SW_{41}$ to $SW_{N1}$ (inactive channels) of the first set of switching devices of the analog summer 315. Additionally, the switch controller 310 opens switching devices $SW_{22}$ and $SW_{32}$ (active channels) and closes switching devices $SW_{12}$ and $SW_{42}$ to $SW_{N2}$ (inactive channels) of the second set of switching devices of the analog summer 315. The closing of switching elements $SW_{21}$ and $SW_{31}$ causes currents to flow through the resistors $R_2$ and $R_3$ to the input of the ADC 320 based on power detector voltages $V_2$ and $V_3$, respectively. The currents are summed at the input of the ADC 320 to produce a cumulative analog signal $P_S$. The closing of switching elements $SW_{12}$ and $SW_{42}$ to $SW_{N2}$ couples the resistors $R_1$ and $R_4$ to $R_N$ to the reference voltage source VREF, which acts as a virtual ground to reduce noise associated with the circuitry of the unselected channels. The opening of switching devices $SW_{11}$, $SW_{41}$ to $SW_{N1}$, $SW_{22}$ and $SW_{32}$ substantially isolates the input of the ADC 320 from the virtual ground of the reference voltage source $V_{REF}$. The cumulative analog signal $P_S$ is an indication of or related to the output signal power level of the transmitter 100.

The ADC 320 converts the cumulative analog signal $P_S$ into a digital signal $P_{DS}$. The digital processing circuit 325 may perform various digital processing operations, such as decimating/averaging the digital signal $P_{DS}$ over a programmable time interval (e.g., one or more OFDM symbol intervals of the transmit signal), correct the decimated/averaged digital signal for offsets associated with the set of power detectors $PDET_1$ to $PDET_N$. The digital processing circuit 325 may also correct for any non-linearity in the analog summer 315, which may also produce errors in the resulting detected power signal $P_T$.

As discussed, in the offset calibration mode as indicated in the modem control signal CNTL1, the transmitter 100 does not transmit a signal. In this mode, the switch controller 310 closes the switching device associated with the power detector whose offset is to be measured for subsequent use in power measurement mode, and opens the remaining switching devices. For example, if the offset associated with power detector $PDET_1$ is to be measured, the switch controller 310 closes switching device $SW_1$ (active channel) and opens switching devices $SW_2$ to $SW_N$ (inactive channels) of the switch network 305, and closes switching device $SW_{11}$ (active channel), opens switching devices $SW_{21}$ to $SW_{N1}$ (inactive channels) and switching device $SW_{12}$ (active channel), and closes switching devices $SW_{22}$ to $SW_{N2}$ (inactive channels) of the analog summer 315.

The closed switching devices $SW_1$ and $SW_{11}$ sends the offset to the input of the ADC 320. The closed switching devices $SW_{22}$ to $SW_{N2}$ couples the resistors $R_2$ to $R_N$ associated with the unselected channels to the virtual ground provided by the reference voltage source $V_{REF}$. The open switching device $SW_{12}$ substantially isolates the input of the ADC 320 from the virtual ground. The ADC 320 digitizes the offset and sends it to the digital processing circuit 325, which stores it in memory, and subsequently uses it to correct the intermediate detected power signal PINT to generate the detected power $P_T$. The offsets associated with the other power detectors $PDET_2$ to $PDET_N$ are measured in similar manner, where the memory of the digital processing circuit 325 stores the offsets associated with the set of power detectors $PDET_2$ to $PDET_N$, respectively. As mentioned above, the offsets of the power detectors may be measured during the R2T time interval in a time-multiplexed manner.

Figure 4:
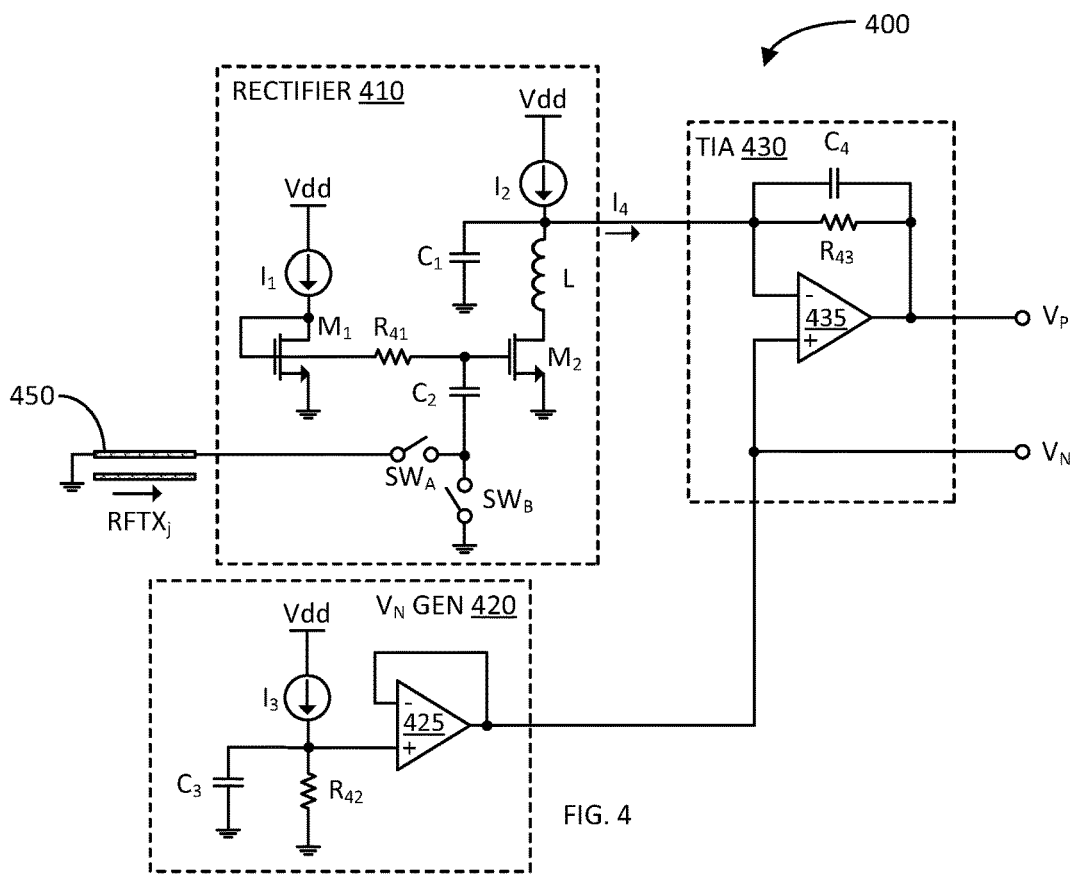
FIG. 4 illustrates a schematic diagram of an example power detector in accordance with another aspect of the disclosure.

FIG. 4 illustrates a schematic diagram of an example power detector 400 in accordance with another aspect of the disclosure. The power detector 400 may be an example detailed implementation of any of the power detectors $PDET_1$ to $PDET_N$ (e.g., $PDET_j$) including the associated coupler $X_1$ to $X_N$ (e.g., $X_j$) previously discussed. It shall be understood that other power detector configurations may be used with the power measurement circuits described herein. The power detector 400 includes a rectifier 410 coupled to an associated coupler 450 (e.g., coupler $X_j$), a transimpedance amplifier (TIA) 430 coupled to the rectifier 410, and a reference voltage generator 420 coupled to the TIA 430. The $RFTX_j$ proximate the coupler 450 represents the corresponding output signal of the corresponding RF transmit chain. It shall be understood that the coupler 450 may be replaced by a resistor or resistor network, and/or one or more switching devices, and/or other circuitry to provide a sample of the $RFTX_j$ signal to the power detector 400.

In more detail, the rectifier 410 includes a first current source $I_1$ coupled in series with a diode-connected field effect transistor (FET) $M_1$ (e.g., an n-channel metal oxide semiconductor (NMOS) FET) between an upper voltage rail Vdd and a lower voltage rail (e.g., ground). The rectifier 410 further includes a second current source $I_2$ coupled in series with an inductor L and a second FET $M_2$ (e.g., NMOS FET) between the upper voltage rail Vdd and ground. A capacitor $C_1$ is coupled between the node between the second current source $I_2$ and the inductor L, and ground. The rectifier 410 further includes a resistor $R_{41}$ coupled between the gate of FET $M_1$ and the gate of FET $M_2$. A capacitor $C_2$ is coupled between the gate of FET $M_2$ and a common first terminal of switching devices $SW_A$ and $SW_B$. The switching device $SW_A$ includes a second terminal coupled to the coupler 450. The switching device $SW_B$ includes a second terminal coupled to ground.

The reference voltage generator 420 provides a DC reference voltage $V_N$ for the TIA 440. The reference voltage generator 420 includes a current source $I_3$ coupled in series with a resistor $R_{42}$ between the upper voltage rail Vdd and ground. The reference voltage generator 420 further includes a capacitor $C_3$ coupled in parallel with the resistor $R_{42}$. Additionally, the reference voltage generator 420 includes an operational amplifier 425 configured as a buffer, including a positive input terminal coupled to the node between the current source $I_3$ and resistor $R_{42}$, and an output terminal coupled to a negative input terminal of the operational amplifier 425. The DC reference voltage $V_N$ is generated at the output terminal of the operational amplifier 425.

The TIA 430 includes an operational amplifier 435 including a negative input terminal coupled to the node between the current source $I_2$ and the inductor L of the rectifier 410. The operational amplifier 435 further includes a positive input terminal coupled to the output terminal of the operational amplifier 425 of the reference voltage generator 420. The TIA 430 further includes a feedback capacitor $C_4$ and a feedback resistor $R_{43}$, both coupled in parallel between an output terminal and the negative input terminal of the operational amplifier 435. The output terminal of the operational amplifier 435 is configured to generate a voltage $V_P$ related to the power level of the corresponding RF transmit signal $RFTX_j$ of the associated transmit chain in power measurement mode, and related to the DC offset of the power detector 400 in calibration mode.

In operation, in power measurement mode, the switching device $SW_A$ is closed and the switching device $SW_B$ is open. The sampled RF signal from the coupler 450 is rectified by the FET $M_2$ in conjunction with the low pass filter (LPF) function of resistor $R_{41}$ and capacitor $C_2$. The rectified RF signal causes the gate voltage of FET $M_2$ to vary with the power level of the RF transmit signal $RFTX_j$; and consequently, the current through FET $M_2$ also varies with the power level of the RF transmit signal $RFTX_j$. Since the current source $I_2$ produces a constant current, the difference between the current generated by the current source $I_2$ and the current through FET $M_2$ produces a current $I_4$ flowing towards the TIA 430. The current $I_4$ flows through the resistor $R_{43}$ to produce the voltage $V_P$ being related to the $I_4 * R_{43} + V_N$. Accordingly, the voltage $V_P$ is indicative of or related to the power level of the RF transmit signal $RFTX_j$ of the associated transmit chain.

In offset calibration mode, the switching device $SW_A$ is in an open state and the switching device $SW_B$ is in a closed state. In this configuration, substantially no RF signal is applied to the rectifier 410 from the coupler 450. In an ideal case, the current sources $I_1$ and $I_2$ generate the same currents. And because of the current mirror configuration of FETs $M_1$ and $M_2$ when no RF is applied to the rectifier 410, the current through the FET $M_2$ ideally is the same as the current generated by current source $I_1$, which is the same as the current generated by current source $I_2$. Thus, ideally, the current $I_4$ is zero (0). However, due to process imperfection, the current sources $I_1$ and $I_2$ do not generate the same currents; and thus, there is a difference between the current generated by the current source $I_2$ and the current through FET $M_2$, resulting in a non-zero current $I_4$. The current $I_4$ flows to the TIA 430, which generates a voltage $V_P$ above $V_N$, which is referred to herein as the DC offset of the power detector 400.

Figure 5:
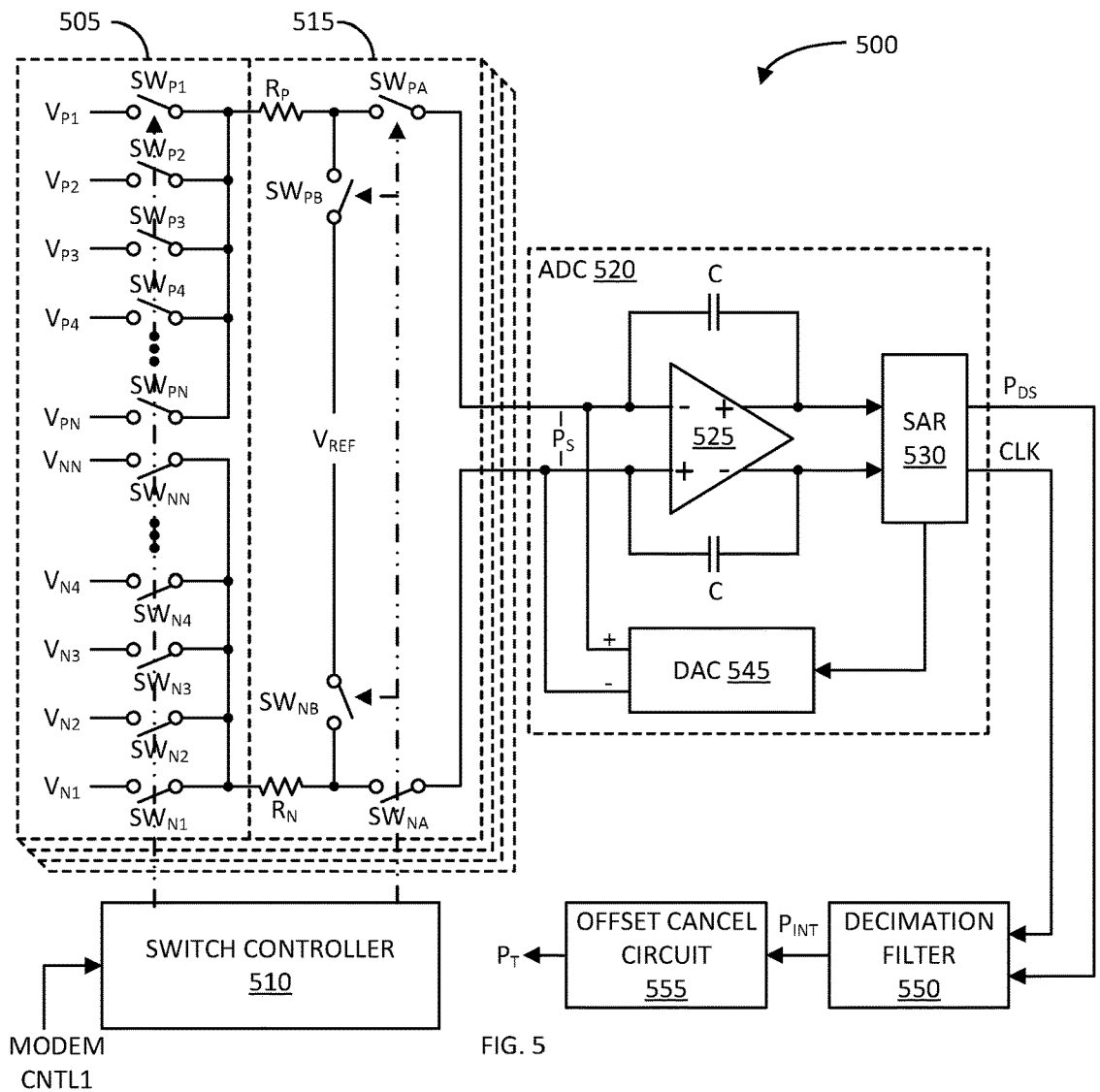
FIG. 5 illustrates a block/schematic diagram of another example transmitter output signal power measurement circuit in accordance with another aspect of the disclosure.

FIG. 5 illustrates a block/schematic diagram of another example transmitter output signal power measurement circuit 500 in accordance with another aspect of the disclosure. The power measurement circuit 500 is configured to process differential voltages $V_{P1}/V_{N1}$ to $V_{PN}/V_{NN}$ generated by the set of power detectors $PDET_1$ to $PDET_N$, respectively. The power measurement circuit 500 also includes a differential successive approximation ADC 520 (also referred to as a sigma-delta quantizer). Additionally, regarding digital processing, the power measurement circuit 500 includes a decimation filter and an offset cancellation circuit.

In particular, the power measurement circuit 500 includes a switch network 505, an analog summer 515, an ADC 520, a decimation filter 550, and an offset cancellation circuit 555. As illustrated, the switch network 505 and analog summer 515 may be implemented in a set of slices as illustrated to provide analog signals pertaining to various transmit chains used for vertical and horizontal spatial processing. The power measurement circuit 500 further includes a switch controller 510 coupled to the modem 105. The switch network 505 includes a first subset of switching devices $SW_{P1}$ to $SW_{PN}$ including first terminals coupled to positive terminals of a set of differential outputs of the set of power detectors $PDET_1$ to $PDET_N$, respectively. The first subset of switching devices $SW_{P1}$ to $SW_{PN}$ includes second terminals coupled together. The switch network 505 further includes a second subset of switching devices $SW_{N1}$ to $SW_{NN}$ including first terminals coupled to negative terminals of the set of differential outputs of the set of power detectors $PDET_1$ to $PDET_N$, respectively. The second subset of switching devices $SW_{N1}$ to $SW_{NN}$ include second terminals coupled together. The subsets of switching devices $SW_{P1}$ to $SW_{PN}$ and $SW_{N1}$ to $SW_{NN}$ include a set of control inputs coupled to the switch controller 510.

The analog summer 515 includes a resistor RP and a switching device $SW_{PA}$ coupled in series between the common second terminals of the first subset of switching devices $SW_{P1}$ to $SW_{PN}$ and a negative terminal of a differential input of the ADC 520. Similarly, the analog summer 515 includes a resistor $R_N$ and a switching device $SW_{NA}$ coupled in series between the common second terminals of the second subset of switching devices $SW_{N1}$ to $SW_{NN}$ and a positive terminal of the differential input of the ADC 520. The analog summer 515 further includes a switching device $SW_{PB}$ coupled between the resistor $R_P$ and a reference voltage source $V_{REF}$. Additionally, the analog summer 515 includes a switching device $SW_{NB}$ coupled between the resistor $R_N$ and the reference voltage source $V_{REF}$. The switching devices $SW_{PA}$, $SW_{PB}$, $SW_{NA}$, and $SW_{NB}$ include a set of control inputs coupled to the switch controller 510.

The ADC 520 includes an operational amplifier 525 including negative and positive terminals of the differential input of the ADC 520. The operational amplifier 525 includes a differential output including positive and negative terminals. A feedback capacitor C is coupled between the positive output terminal and the negative input terminal of the operational amplifier 525. Another feedback capacitor C is coupled between the negative output terminal and the positive input terminal of the operational amplifier 525. The ADC 520 further includes a successive approximation register (SAR) 530 including a differential input coupled to the differential output of the operational amplifier 525. The SAR 530 includes a feedback output coupled to an input of a digital-to-analog converter (DAC) 545. The DAC 545 includes a differential output with positive and negative terminals coupled to the negative and positive input terminals of the operational amplifier 525, respectively. The SAR 530 includes a data output to produce a digital signal $P_{DS}$ and a clock output to produce a clock (CLK) with a frequency at the sampling rate of the digital signal $P_{DS}$.

The data and clock outputs of the SAR 530 are coupled to inputs of the decimation filter 550. The decimation filter 550 averages and decimates the digital signal $P_{DS}$ to generate an intermediate detected power signal $P_{INT}$ with a sampling rate lower than the sampling rate of the digital signal $P_{DS}$. The decimation filter 550 includes an output, where the intermediate detected power signal $P_{INT}$ is produced, coupled to an input of the offset cancellation circuit 555. The offset cancellation circuit 555 corrects/modifies the intermediate detected power signal $P_{INT}$ based on previously measured offsets from the set of power detectors $PDET_1$ to $PDET_N$ during calibration mode, and may further correct the intermediate detected power signal $P_{INT}$ for non-linearity of the analog summer 515 to generate the transmitter detected power signal $P_T$.

Considering a power measurement mode example, based on a current transmission profile as set by the modem 105, the transmit chains 125-2 and 125-3 are active (e.g., active channels 2-3) to generate RF transmit signals $RFTX_2$ and $RFTX_3$ based on the RF signal from the RF filter 120, respectively; while the other transmit chains 125-1 and 125-4 to 125-N are inactive (e.g., inactive channels 1 and 4-N). Accordingly, based on the modem control signal CNTL1, the switch controller 510 closes differential switching devices $SW_{P2}/SW_{N2}$ and $SW_{P3}/SW_{N3}$ (active channels) and opens the remaining differential switching devices $SW_{P1}/SW_{N1}$ and $SW_{P4}/SW_{N4}$ to $SW_{PN}/SW_{NN}$ (inactive channels) of the switch network 505. The closing of differential switching devices $SW_{P2}/SW_{N2}$ and $SW_{P3}/SW_{N3}$ sends the differential voltages $V_{P2}/V_{N2}$ and $V_{P3}/V_{N3}$ to the differential inputs of the analog summer 515. The opening of the differential switching devices $SW_{P1}/SW_{N1}$ and $SW_{P4}/SW_{N4}$ to $SW_{PN}/SW_{NN}$ substantially isolates the differential input of the analog summer 515 from the power detectors $PDET_1$ and $PDET_4$ to $PDET_N$ associated with the inactive channels, respectively.

Further, based on the modem control signal CNTL1, the switch controller 510 closes switching devices $SW_{PA}$ and $SW_{NA}$ and opens switching devices $SW_{PB}$ and $SW_{NB}$ of the analog summer 515. The closing of switching elements $SW_{PA}$ and $SW_{NA}$ causes currents to flow through the resistors $R_P$ and $R_N$ to the differential input of the ADC 520 based on power detector differential voltages $V_{P2}/V_{N2}$ and $V_{P3}/V_{N3}$. The currents are summed at the differential input of the ADC 520 to produce a cumulative analog signal $P_S$. The opening of switching devices $SW_{PB}$ and $SW_{NB}$ substantially isolates the differential input of the ADC 520 from a virtual ground provided by the reference voltage source $V_{REF}$. The cumulative analog signal $P_S$ is an indication of or related to the output signal power of the transmitter 100.

Through a series of successive approximation cycles, the ADC 520 converts the cumulative analog signal $P_S$ into a digital signal $P_{DS}$ and produces a clock (CLK) with a frequency at the sampling rate of the digital signal $P_{DS}$. As previously mentioned, the decimation filter 550 averages and decimates the digital signal $P_{DS}$ to generate the intermediate detected power signal $P_{INT}$ with a sampling rate lower than the sampling rate of the digital signal $P_{DS}$. The offset cancellation circuit 555 corrects/modifies the intermediate detected power signal $P_{INT}$ based on previously measured offsets from the set of power detectors $PDET_1$ to $PDET_N$ during calibration mode, and may further correct the intermediate detected power signal $P_{INT}$ for non-linearity associated with the analog summer 515 to generate the transmitter detected power signal $P_T$.

As discussed, in offset calibration mode, the transmitter 100 does not transmit a signal. based on the modem control signal CNTL1, the switch controller 510 closes the differential switching devices associated with the power detector whose offset is to be measured for subsequent use in power measurement mode, and opens the remaining differential switching devices. For example, if the offset associated with power detector $PDET_1$ is to be measured, the switch controller 510 closes differential switching device $SW_{P1}/SW_{N1}$ (active channel) and opens differential switching devices $SW_{P2}/SW_{N2}$ to $SW_{PN}/SW_{NN}$ (inactive channels) of the switch network 505, closes differential switching device $SW_{PA}/SW_{NA}$, and opens differential switching devices $SW_{PB}/SW_{NB}$ of the analog summer 515.

The closing of differential switching devices $SW_{P1}/SW_{N1}$ sends the differential offset voltages $V_{P1}/V_{N1}$ to the differential inputs of the analog summer 515. The opening of the differential switching devices $SW_{P2}/SW_{N2}$ to $SW_{PN}/SW_{NN}$ substantially isolates the differential input of the analog summer 515 from the power detectors $PDET_2$ to $PDET_N$ associated with the inactive channels, respectively. The closing of switching elements $SW_{PA}$ and $SW_{NA}$ causes currents to flow through the resistors $R_P$ and $R_N$ to the differential input of the ADC 520 based on offset differential voltages $V_{P1}/V_{N1}$. The currents are summed at the differential input of the ADC 520 to produce a cumulative analog signal $P_S$. The opening of switching devices $SW_{PB}$ and $SW_{NB}$ substantially isolates the differential input of the ADC 520 from the virtual ground of the reference voltage source $V_{REF}$.

Through successive approximation cycles, the ADC 520 digitizes the differential offset voltage and sends it to the decimation filter 550 for averaging and decimation purposes. The averaged/decimated offset voltage is then sent to the offset cancellation circuit 555, which stores it in memory for subsequent use in correcting/modifying the intermediated detected power signal $P_{INT}$. The offset voltages associated with the other power detectors $PDET_2$ to $PDET_N$ are measured in similar manner, where the memory of the offset cancellation circuit 555 stores the offsets associated with the set of power detectors $PDET_2$ to $PDET_N$, respectively. As mentioned above, the offsets of the power detectors may be measured during the R2T time interval in a time-multiplexed manner.

Figure 6A:
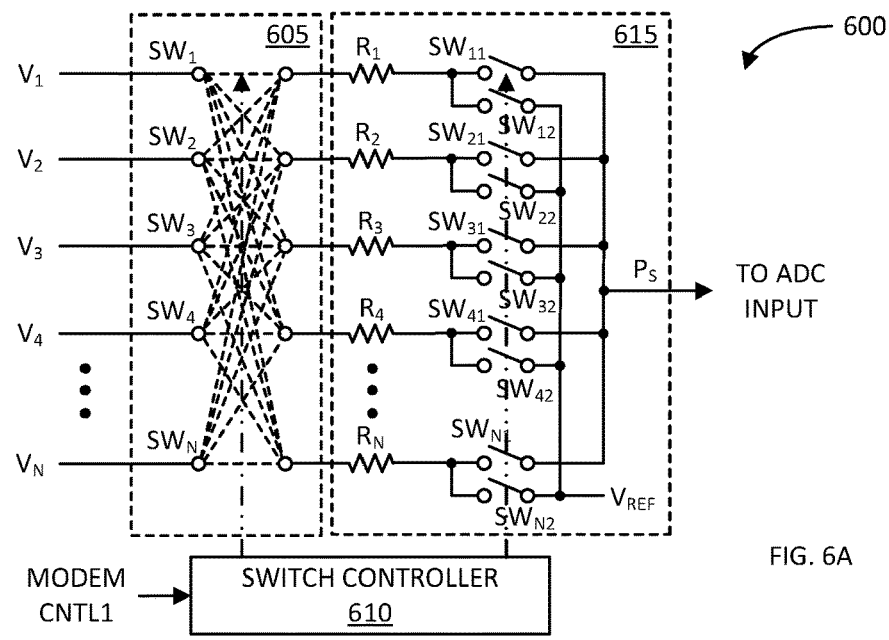
FIG. 6A illustrates a schematic diagram of another example transmitter output signal power measurement circuit in accordance with another aspect of the disclosure.

FIG. 6A illustrates a schematic diagram of an example power measurement circuit 600 in accordance with another aspect of the disclosure. In this example, the power measurement circuit 600 includes a switch network configured as a switch matrix. That is, each input of the switch network may be simultaneously and selectively coupled to one or more of a set of N outputs of the switch network.

In power measurement mode, each switching device couples its input to the output corresponding to the channel being measured; e.g., switching device $SW_1$ couples input "1" to output "1", where "1" identifies the channel being measured. In calibration mode, each switching device couples the input of the corresponding channel being calibrated to two or more of the N outputs of the switch network. As the offset voltage of each power detector may be relatively small, coupling the input to two or more of the N outputs in the switch network effectively increases the gain associated with routing the offset to an ADC by two or more times (e.g., N times), respectively; allowing the ADC and the following digital processing circuits to measure the offset more accurately.

In particular, the power measurement circuit 600 includes a switch network 605, an analog summer 615, and a switch controller 610. The power management circuit 600 may further include an ADC and a digital processing circuit as discussed herein with respect to other example implementations.

The switch network 605 includes a set of N switching devices $SW_1$ to $SW_N$ including input terminals coupled to a set of power detectors $PDET_1$ to $PDET_N$ to receive a set of voltages $V_1$ to $V_N$, respectively. Each of the switching devices includes a set of throws configured to couple its input terminal to its output terminal and to the output terminal(s) of one or more other of the N-1 switching devices. For example, switching device $SW_1$ may be configured to couple its input terminal to its output terminal and the output terminals of switching devices $SW_2$ to $SW_N$; switching device $SW_2$ may be configured to couple its input terminal to its output terminal and the output terminals of switching devices $SW_1$ to $SW_3$ to $SW_N$; switching device $SW_3$ may be configured to couple its input terminal to its output terminal and the output terminals of switching devices $SW_1$ to $SW_2$ and $SW_4$ to $SW_N$; and so on.

The analog summer 615 may be configured similar to analog summer 315. That is, the analog summer 615 includes a set of resistors $R_1$ to $R_N$, a first set of switching devices $SW_{11}$ to $SW_{N1}$, and a second set of switching devices $SW_{12}$ to $SW_{N2}$. The set of resistors $R_1$ to $R_N$ is coupled between the set of switching devices $SW_1$ to $SW_N$ of the switch network 605 and the first set of switching devices $SW_{11}$ to $SW_{N1}$, respectively. The first set of switching devices $SW_{11}$ to $SW_{N1}$ is coupled between the set of resistors $R_1$ to $R_N$ and an input of an ADC. The second set of switching devices $SW_{12}$ to $SW_{N2}$ is coupled between the set of resistors $R_1$ to $R_N$ and a reference voltage source $V_{REF}$. The switch controller 610, which may be coupled to modem 105 to receive the control signal CNTL1, are coupled to a set of control inputs of the set of switching devices $SW_1$ to $SW_N$ of the switch network 605, and a set of control inputs of the first and second sets of switching devices $SW_{11}$ to $SW_{N1}$ and $SW_{12}$ to $SW_{N2}$, respectively.

Figure 6B:
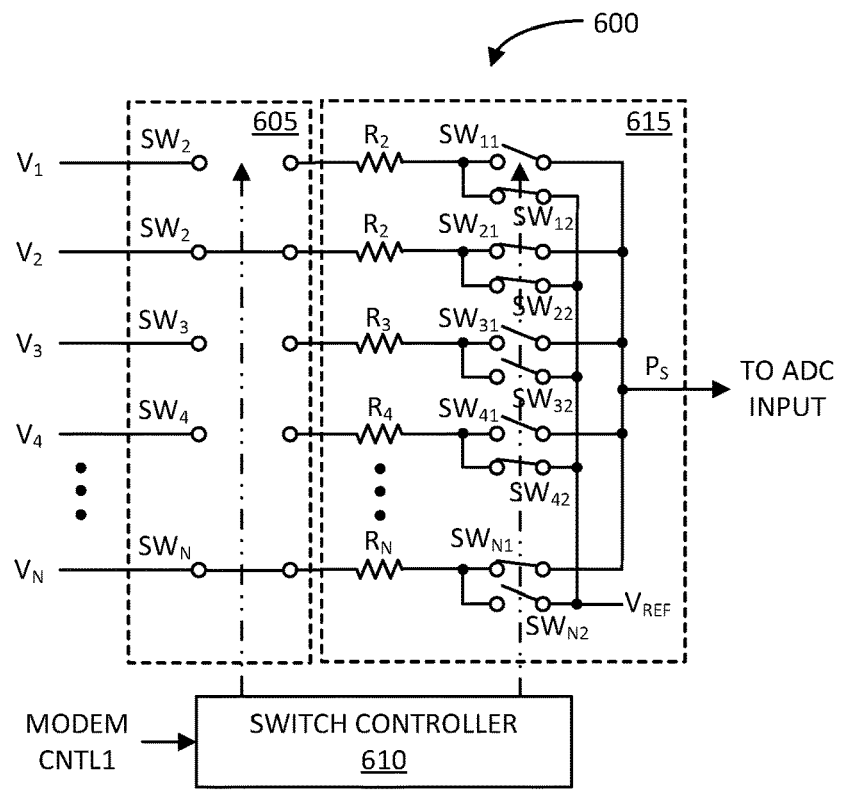
FIG. 6B illustrates a schematic diagram of the example transmitter output signal power measurement circuit of FIG. 6A in a power measurement mode in accordance with another aspect of the disclosure.

FIG. 6B illustrates a schematic diagram of the example power measurement circuit 600 in a power measurement mode in accordance with another aspect of the disclosure. In power management mode, the power measurement circuit 600 is configured to provide the cumulative analog signal $P_S$ related to the total output signal power of the transmitter 100 to the ADC. In the example of FIG. 6B, RF transmit chains 125-2 and 125-N are enabled to provide the RF transmit signals $RFTX_2$ and $RFTX_N$ to the antennas $ANT_2$ and $ANT_N$ for transmission, respectively (channels 2 and N are active); the remaining transmit chains 125-1 and 125-3 to 125-N-1 are disabled (channels 1 and 3 to N-1 are inactive).

Via the control signal CNTL1, the modem 105 provides the switch controller 610 the information regarding which transmit chains are enabled and which ones are disabled; and, in response, the switch controller 610 closes switching devices $SW_2$ and $SW_N$ and opens switching devices $SW_1$ and $SW_3$ to $SW_{N-1}$ of the switch network 605. Also, in response to the control signal CNTL1, the switch controller 610 closes switching devices $SW_{21}$ and $SW_{N1}$ (active channels) and opens switching devices $SW_{11}$ and $SW_{31}$ to $SW_{N-11}$ (inactive channels) of the first set of switching devices of the analog summer 615. Additionally, in response to the control signal CNTL1, the switch controller 610 closes switching devices $SW_{12}$, $SW_{32}$ to $SW_{N-22}$ (inactive channels) and opens switching devices $SW_{22}$ and $SW_{N2}$ (active channels) of the second set of switching devices of the analog summer 615.

Thus, the voltages $V_2$ and $V_N$ of the power detectors $PDET_2$ and $PDET_N$ of the enabled transmit chains 125-2 and 125-N are provided to the analog summer 615 via closed switching devices $SW_2$ and $SW_N$, respectively. The open switching devices $SW_1$ and $SW_3$ to $SW_{N-1}$ substantially isolates the analog summer 615 from the power detectors $PDET_1$ and $PDET_3$ to $PDET_N$ of the disabled transmit chains 125-1, 125-3 to 125-N-1, respectively. The closed switching devices $SW_{21}$ and $SW_{N1}$ route currents through resistors $R_2$ and $R_N$ as a result of voltages $V_2$ and $V_N$ to be summed at the input of the ADC to generate the cumulative analog signal $P_S$ for digitizing purposes. The closing of switching devices $SW_{12}$ and $SW_{32}$ to $SW_{N-12}$ couples virtual ground provided by the reference voltage source $V_{REF}$ to these switching devices for noise reduction purposes. The opening of switching devices $SW_{11}$, $SW_{22}$, $SW_{31}$ to $SW_{N-11}$, and $SW_{N2}$ substantially isolates the input of the ADC from the virtual ground of the reference voltage source $V_{REF}$.

Figure 6C:
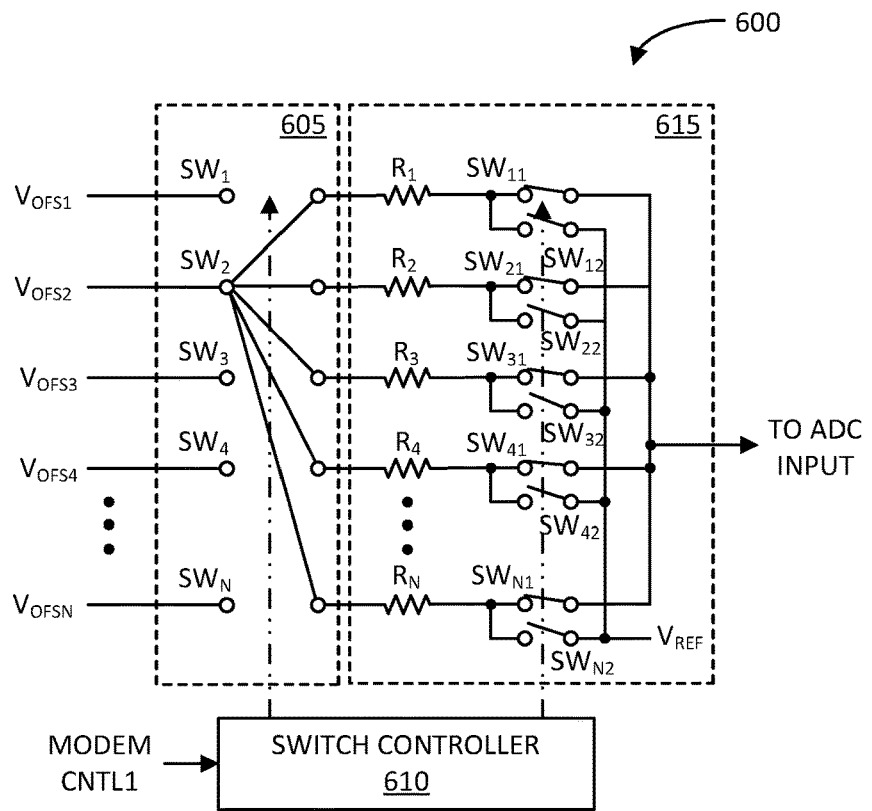
FIG. 6C illustrates a schematic diagram of the example transmitter output signal power measurement circuit of FIG. 6A in offset calibration mode in accordance with another aspect of the disclosure.

FIG. 6C illustrates a schematic diagram of the example power measurement circuit 600 in offset calibration mode in accordance with another aspect of the disclosure. In offset calibration mode, the power measurement circuit 600 is configured to provide the offset voltages $V_{OFS1}$ to $V_{OFSN}$ of the set of power detectors $PDET_1$ to $PDET_N$ to the ADC in a time-multiplexed manner. In the example of FIG. 6C, the offset voltage $V_{OFS2}$ of power detector $PDET_2$ is provided to the input of the ADC for digitizing purposes.

The modem 105 instructs the switch controller 610 to perform an offset calibration associated with the power detectors $PDET_1$ to $PDET_N$ via the control signal CNTL1. In this example, during the time-multiplexed cycle of measuring the offset voltage $V_{OFS2}$ of power detector $PDET_2$, the switch controller 610 configures switching device $SW_2$ to couple its input terminal to the output terminals of the switching devices $SW_1$ to $SW_N$, respectively. The switch controller 610 also configures switching devices $SW_1$ and $SW_3$ to $SW_N$ to decouple their input terminals from the output terminals of the switch network 605. Further, the switch controller 610 closes the first set of switching devices $SW_{11}$ to $SW_{N1}$ and opens the second set of switching devices $SW_{12}$ to $SW_{N2}$ of the second set of switching devices of the analog summer 615.

Thus, the offset voltage $V_{OFS2}$ of the power detector $PDET_2$ is provided to the analog summer 615 via the input terminal of switching device $SW_2$ and the output terminals of switching devices $SW_1$ to $SW_N$, respectively. The switching devices $SW_1$ and $SW_3$ to $SW_N$ being configured to decouple their input terminals from the output terminals of the switch network 605 substantially isolates the analog summer 615 from the power detectors $PDET_1$ and $PDET_3$ to $PDET_N$ associated with the inactive channels, respectively. The closed switching devices $SW_{11}$ to $SW_{N1}$ route currents through resistors $R_1$ to $R_N$ as a result of the offset voltage $V_{OFS2}$ to be summed at the input of the ADC to digitize generate the offset signal from the power detector $PDET_2$. The opening of switching devices $SW_{12}$ to $SW_{N2}$ substantially isolates the input of the ADC from the virtual ground of the reference voltage source $V_{REF}$.

Figure 6D:
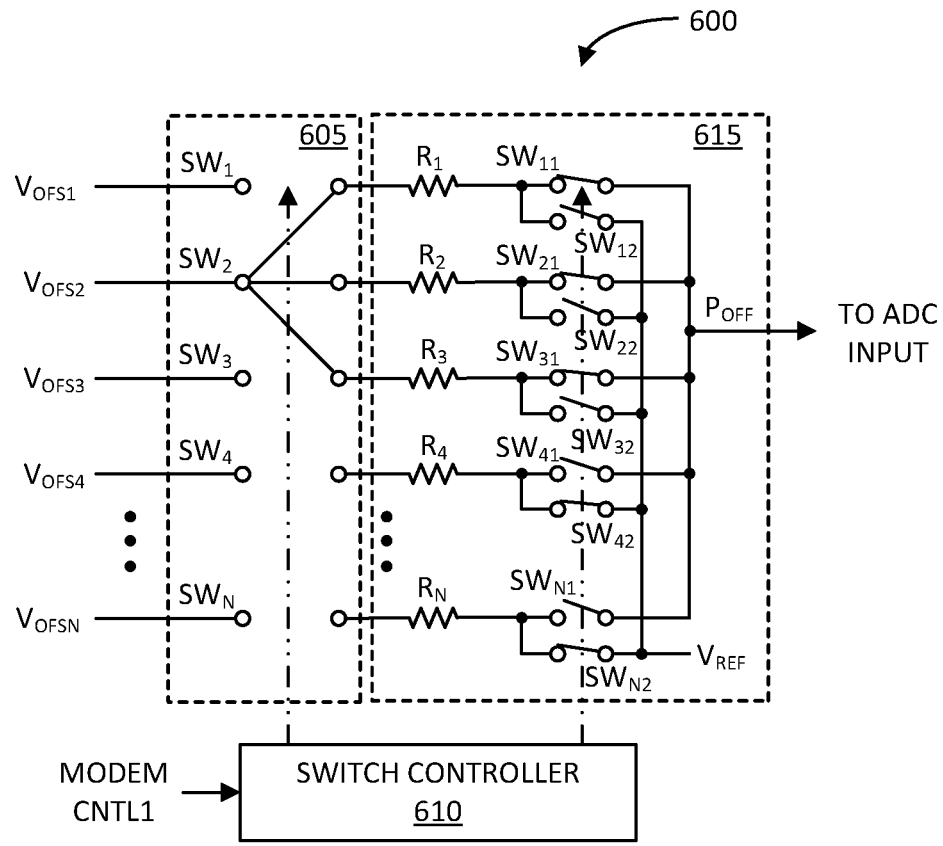
FIG. 6D illustrates a schematic diagram of the example transmitter output signal power measurement circuit of FIG. 6A in the offset calibration mode in accordance with another aspect of the disclosure.

FIG. 6D illustrates a schematic diagram of the example power measurement circuit 600 in offset calibration mode in accordance with another aspect of the disclosure. In the example of FIG. 6C, the switch network 605 and analog summer 615 were configured to provide the offset voltage $V_{OFS2}$ of power detector $PDET_2$ to the input of the ADC via the N channels of the analog summer 615. However, it shall be understood that the offset voltage of any of the power detectors may be provided to the input of the ADC via less than the N channels. For instance, in the example of FIG. 6D, the offset voltage $V_{OFS2}$ of power detector $PDET_2$ is provided to the input of the ADC via channels 1-3 of the analog summer 615 (where N>3).

The modem 105 instructs the switch controller 610 to perform a DC offset calibration associated with the power detectors $PDET_1$ to $PDET_N$ via the control signal CNTL1. In this example, during the time-multiplexed cycle of measuring the offset $V_{OFS2}$ of power detector $PDET_2$, the switch controller 610 configures switching device $SW_2$ to couple its input terminal to the output terminals of the switching devices $SW_1$ to $SW_3$, respectively. The switch controller 610 also configures switching devices $SW_1$ and $SW_3$ to $SW_N$ to decouple their input terminals from the output terminals of the switch network 605. Further, the switch controller 610 closes switching devices $SW_{11}$ to $SW_{31}$ and opens switching devices $SW_{12}$ to $SW_{32}$ (active channels), and closes switching devices $SW_{42}$ to $SW_{N2}$ and opens switching devices $SW_{41}$ and $SW_{N1}$ (inactive channels) of the analog summer 615.

Thus, the offset voltage $V_{OFS2}$ of the power detector $PDET_2$ is provided to the analog summer 615 via the input terminal of switching device $SW_2$ and the output terminals of switching devices $SW_1$ to $SW_3$, respectively. The switching devices $SW_1$ and $SW_3$ to $SW_N$ are configured to decouple their input terminals from the output terminals of the switch network 605 to substantially isolate the analog summer 615 from the power detectors $PDET_1$ and $PDET_3$ to $PDET_N$ associated with the inactive channels, respectively. The closed switching devices $SW_{11}$ to $SW_{31}$ route currents through resistors $R_1$ to $R_3$ as a result of the offset voltage $V_{OFS2}$ to be summed at the input for digitizing purposes. The closing of switching devices $SW_{42}$ to $SW_{N2}$ couples the virtual ground provided by the reference voltage source $V_{REF}$ to these switching devices for noise reduction purposes. And, the opening of switching devices $SW_{41}$ to $SW_{N1}$ substantially isolates the input of the ADC from the virtual ground of the reference voltage source $V_{REF}$.

Figure 7:
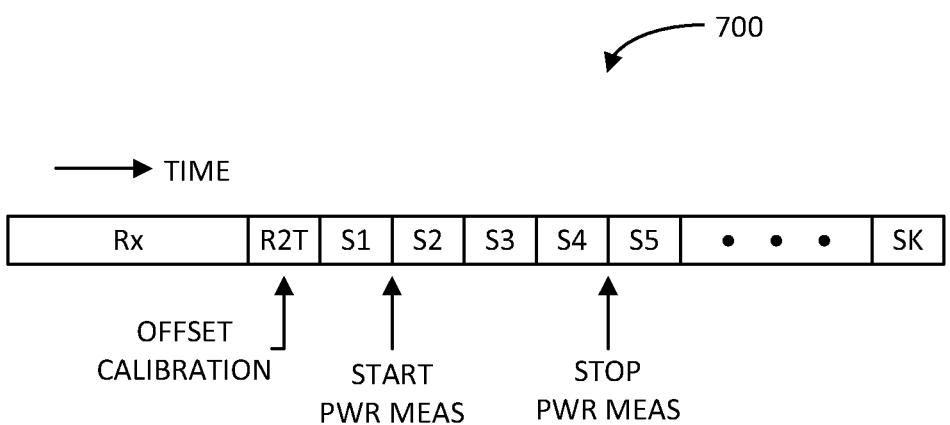
FIG. 7 illustrates a timing diagram depicting an example operation of a transmitter output signal power measurement circuit in accordance with another aspect of the disclosure.

FIG. 7 illustrates a timing diagram depicting an example operation of transmitter output power measurement 700 in accordance with another aspect of the disclosure. The horizontal axis of the graph represents time. The various time intervals depicted as connected rectangles represents the mode in which the modem 105 is operating. For example, from left-to-right, the modem 105 operates in a receive (Rx) mode followed by a receive-to-transmit (R2T) transition mode, and followed by a transmit mode including a set of OFDM transmit symbol intervals 51 to SK.

As previously mentioned, the modem 105 may configure a power measurement circuit in offset calibration mode during the R2T transition interval as the transmitter 100 is not transmitting any signals. It shall be understood that the modem 105 may configure the power measurement circuit in the offset calibration mode during the receive (Rx) interval. The modem 105 may configure the power measurement circuit to perform measurements of the output signal power of the transmitter over one or more OFDM symbol intervals, such as OFDM symbol intervals S2 to S4 as illustrated. Although not required, the power management circuit may be configured to start the transmitter power measurement after the first OFDM symbol S1 to allow time to configure the power measurement circuit.

Figure 8:
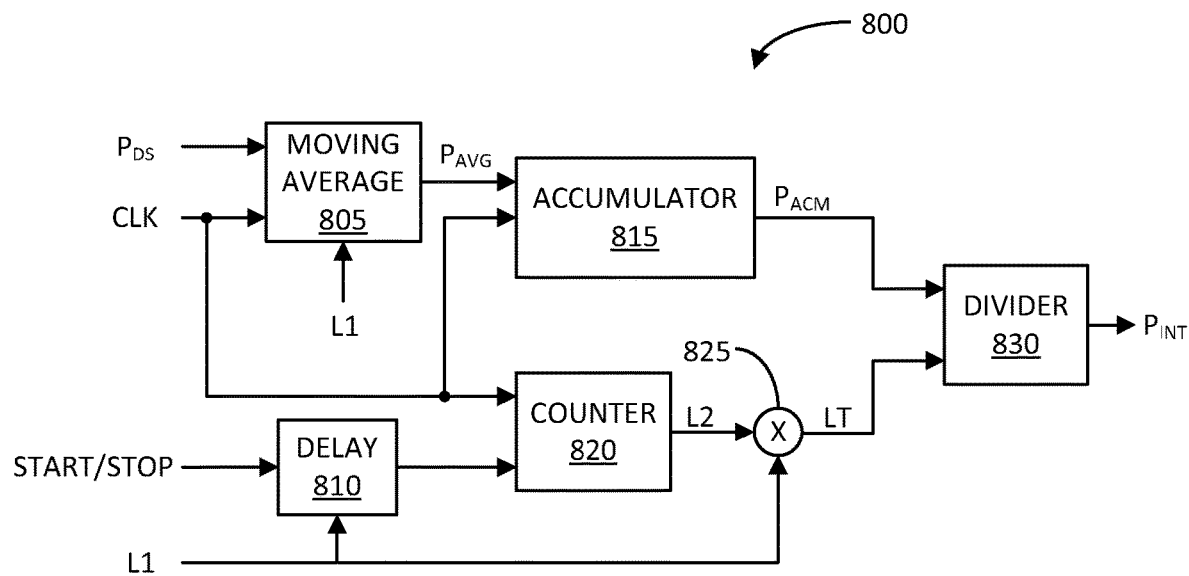
FIG. 8 illustrates a block diagram of an example decimation filter in accordance with another aspect of the disclosure.

FIG. 8 illustrates a block diagram of an example decimation filter 800 in accordance with another aspect of the disclosure. The decimation filter 800 may be an example detailed implementation of the decimation filter 550 previously discussed. The decimation filter 800 includes a moving average circuit 805, a delay 810, an accumulator 815, a counter 820, a multiplier 825, and a divider 830.

The moving average circuit 805 includes inputs coupled to the outputs of the ADC 520 to receive the digital signal $P_{DS}$ and clock (CLK), and averages the digital signal $P_{DS}$ over a programmable length L1 samples to generate a moving average signal $P_{AVG}$ As the digital signal $P_{DS}$ is the digitized cumulative analog signal $P_S$, which is related to or indicative of the transmitter output signal power, the moving average signal $P_{AVG1}$ is related to or indicative of the transmitter output signal power averaged over a time interval of L1 samples of the digital signal $P_{DS}$.

The accumulator 815 includes a first input coupled to the output of the moving average circuit 805 and a second input coupled to the clock output of the ADC 520 to receive the clock (CLK), and accumulates the moving average signal $P_{AVG}$ over a time interval of L2 samples to generate an accumulated moving average signal $P_{ACM}$. The counter 820 is configured to track the number of samples L2 in response to the start/stop signal. In this regard, the counter 820 receives the clock (CLK) and a start/stop signal via the delay 810. The delay 810 delays the start/stop signal by the programmable interval of length L1 so that the counter 820 begins counting once the moving average circuit 805 generates the moving average signal $P_{AVG}$ based on L1 samples. The multiplier 825 multiplies L1 with L2 to generate LT, which represents the total number of samples over which the accumulated signal $P_{ACM}$ is based. The divider 830 divides the accumulated signal $P_{ACM}$ by the total number of samples LT to generate an intermediate power signal $P_{INT}$. The intermediate power signal $P_{INT}$ is related to or an indication of the transmitter output signal power (second-order) averaged over an interval of LT samples. The decimation filter 800 has desirable signal-to-quantization ratio (SNQR) and relatively low averaging error performance.

Figure 9:
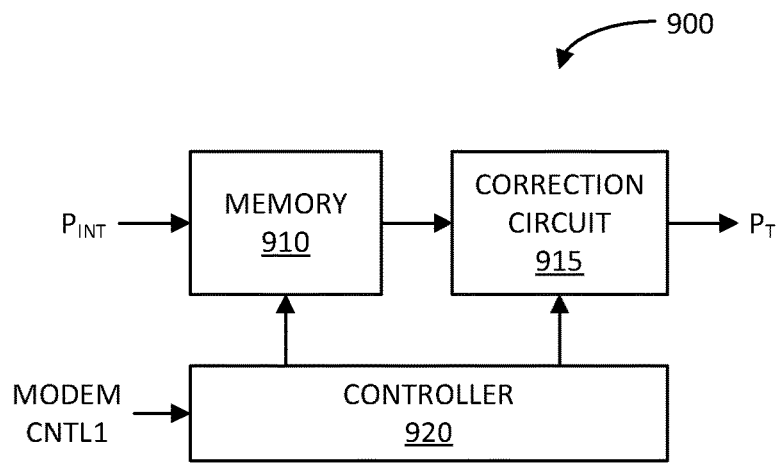
FIG. 9 illustrates a block diagram of an example offset correction circuit in accordance with another aspect of the disclosure.

FIG. 9 illustrates a block diagram of an example offset cancellation circuit 900 in accordance with another aspect of the disclosure. The offset cancellation circuit 900 may be an example detailed implementation of the offset cancellation circuit 555 previously discussed. The offset cancellation circuit 900 includes a memory 910, a correction circuit 915, and a controller 920 (e.g., a finite state machine (FSM)). The controller 920 may be coupled to the modem 105 to receive the control signal CNTL1.

In offset calibration mode as indicated by the modem 105, the memory 910 is configured to receive a set of intermediate power signals $P_{INT}$ in a time-multiplexed manner. The set of intermediate power signals $P_{INT}$ may be related to offsets of the set of power detectors $P_{DET1}$ to $P_{DETN}$, respectively. The controller 920 causes the memory 910 to store the set of intermediate power signals $P_{INT}$, for example, in a table, which also provides a mapping to the set of power detectors $P_{DET1}$ to $P_{DETN}$, respectively. The memory 910 may store other corrective parameters, such as, corrections for non-linearity introduced by the analog summer described herein. The non-linearity corrections may have been determined during a factory-calibration procedure.

In power measurement mode as indicated by the modem 105, the controller 920 causes the memory 910 to receive the intermediate power signal $P_{INT}$ which, as previously described, may be an average or second-order average of the output signal power of the transmitter 100 over a certain time interval (e.g., one or more OFDM symbol intervals). Under the control of the controller 920, the correction circuit 915 access the intermediate power signal $P_{INT}$ and one or more relevant offsets from the memory 910, and corrects/modifies the intermediate power signal $P_{INT}$ using the relevant one or more offsets to generate the transmitter detected power signal $P_T$.

The one or more relevant offsets pertains to the power detectors of the enabled transmit chains used to generate the transmit signal upon which the intermediate power signal $P_{INT}$. For example, if the enabled transmit chains are 125-2 and 125-3 (and the rest of the transmit chains 125-1 and 125-4 to 125-N are disabled), the offsets associated with power detectors $PDET_2$ and $PDET_3$ are used to correct the intermediate power signal $P_{INT}$ (the offsets pertaining to the power detectors $PDET_1$ and $PDET_4$ to $PDET_N$ of the disabled transmit chains 125-1 and 125-4 to 125-N are not used to the intermediate power signal $P_{INT}$ during the current measurement cycle in this example).

Figure 10:
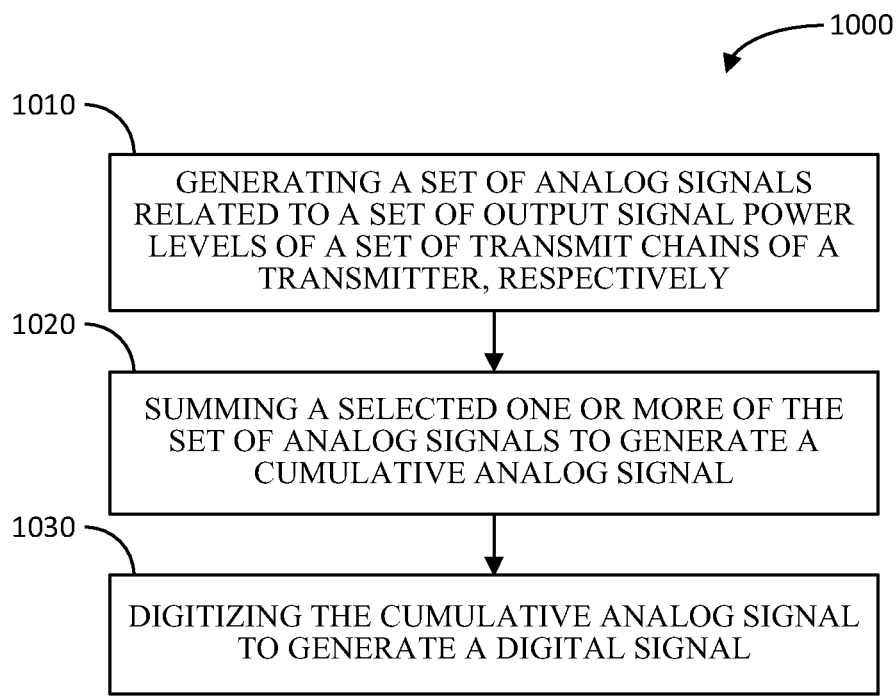
FIG. 10 illustrates a flow diagram of an example method of detecting an output signal power of a transmitter in accordance with another aspect of the disclosure.

FIG. 10 illustrates a flow diagram of an example method 1000 of measuring an output power of a transmitter signal in accordance with another aspect of the disclosure. The method 1000 includes generating a set of analog signals related to a set of output signal power levels of a set of transmit chains of a transmitter, respectively (block 1010). Examples of means for generating a set of analog signals related to a set of output signal power levels of a set of transmit chains of a transmitter, respectively, include the set of power detectors $PDET_1$ to $PDET_N$ described herein.

The method 1000 further includes summing a selected one or more of the set of analog signal to generate a cumulative analog signal (block 1020). Examples of means for summing a selected one or more of the set of analog signal to generate a cumulative analog signal include any of the analog summers described herein. Further, the method 1000 includes digitizing the cumulative analog signal to generate a digital signal (block 1030). Examples of means for digitizing the cumulative analog signal to generate a digital signal include any of the ADCs described herein.

Figure 11:
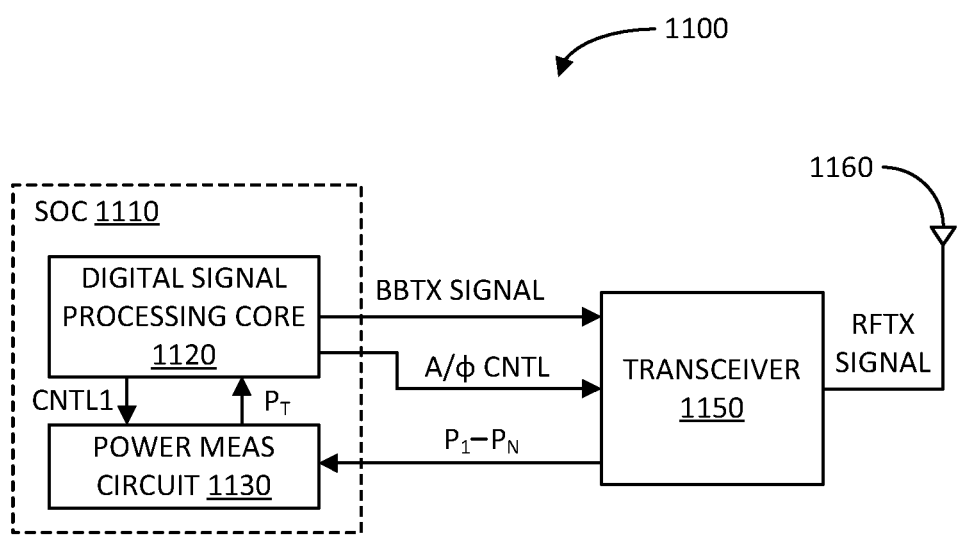
FIG. 11 illustrates a block diagram of an example wireless communication device in accordance with another aspect of the disclosure.

FIG. 11 illustrates a block diagram of an example wireless communication device 1100 in accordance with another aspect of the disclosure. The wireless communication device 1100 includes an integrated circuit (IC) 1110, a transceiver 1150, and at least one antenna or antenna array 1160. The IC 1110, which may be configured as a system on chip (SOC), may include one or more digital processing cores 1120 and a power measurement circuit 1130. The one or more digital processing cores 1120 may implement the functionality of the modem 105 previously discussed. That is, the one or more digital processing cores 1120 may be configured to generate a baseband transmit signal BBTX.

The power measurement circuit 1130 may be configured per any of the power measurement circuit previously discussed. The one or more digital processing cores 1120 may provide control signal CNTL1 to the power measurement circuit 1130 as previously discussed, and the power measurement circuit 1130 may provide the transmitter detected power signal $P_T$ to the one or more digital processing cores 1120. The one or more digital processing cores 1120 may generate power/phase A/φ control signal based on the power measurement signal $P_T$. The one or more digital processing cores 1120 may provide the baseband transmit signal BBTX and the power/phase A/φ control signal to the transceiver 1150.

The transceiver 1150 may include the mixer 110, LO 115, RF filter 120, and the set of transmit chains 125-1 to 125-N previously discussed. Accordingly, the transceiver 1150 generates the total RF transmit signal RXTX based on the baseband transmit signal BBTX signal and the power/phase A/φ control signal. The output power and beamforming of the transceiver 1150 is controlled by the power/phase A/φ control signal. The power detectors $PDET_1$ to $PDET_N$ of the transceiver 1150 provide the analog signals $P_1$ to $P_N$ related to or indicative of the output signal power levels of the transmit chains 125-1 to 125-N, respectively. As previously discussed, the power measurement circuit 1130 generates the transceiver detected power signal $P_T$ based on one or more of the analog signals $P_1$ to $P_N$ from the power detectors $PDET_1$ to $PDET_N$, respectively The following provides an overview of aspects of the present disclosure:

Aspect 1: An apparatus, including a set of power detectors coupled to a set of transmit chains of a transmitter, respectively; an analog summer; a first set of switching devices coupled between the set of power detectors and an input of the analog summer, respectively; and an analog-to-digital converter (ADC) including an input coupled to an output of the analog summer, and an output configured to produce a first digital signal related to an output power of the transmitter.

Aspect 2: The apparatus of aspect 1, wherein the analog summer includes a set of resistors coupled between the first set of switching devices and the input of the ADC, respectively.

Aspect 3: The apparatus of aspect 2, wherein the analog summer further includes a second set of switching devices coupled between the set of resistors and the input of the ADC, respectively.

Aspect 4: The apparatus of aspect 3, wherein the analog summer further includes a third set of switching devices coupled between the set of resistors and a reference voltage source, respectively.

Aspect 5: The apparatus of any one of aspects 1-4, wherein the set of power detectors include a set of differential outputs, respectively; the first set of switching devices includes a first subset of switching devices coupled to positive terminals of the set of differential outputs of the set of power detectors, respectively; and the first set of switching devices includes a second subset of switching devices coupled to negative terminals of the set of differential outputs of the set of power detectors, respectively.

Aspect 6: The apparatus of aspect 5, wherein the input of the ADC includes a differential input, and wherein the analog summer includes: a first resistor coupled between the first subset of switching devices and a first terminal of the differential input of the ADC; and a second resistor coupled between the second subset of switching devices and a second terminal of the differential input of the ADC.

Aspect 7: The apparatus of aspect 6, wherein the analog summer further includes: a first switching device coupled between the first resistor and the first terminal of the ADC; and a second switching device coupled between the second resistor and the second terminal of the ADC.

Aspect 8: The apparatus of aspect 7, wherein the analog summer further includes: a third switching device coupled between the first resistor and a reference voltage source; and a fourth switching device coupled between the second resistor and the reference voltage source.

Aspect 9: The apparatus of any one of aspects 1-8, wherein each of the first set of switching devices includes a set of throws for selectively coupling its first terminal to one or more second terminals of the first set of switching devices, respectively.

Aspect 10: The apparatus of any one of aspects 1-8, wherein the first set of switching devices is part of a switch matrix, wherein each switching device of the first set includes an input terminal configured to selectively and simultaneously be coupled to one or more output terminals of the first set of switching devices, respectively.

Aspect 11: The apparatus of any one of aspects 1-10, further including a controller coupled to a set of control inputs of the first set of switching devices, respectively.

Aspect 12: The apparatus of any one of aspects 1-11, wherein the ADC includes a successive approximation ADC.

Aspect 13: The apparatus of any one of aspects 1-12, wherein the ADC includes: an operational amplifier including a differential input and a differential output, wherein the input of the ADC includes the differential input; a first capacitor coupled between a positive terminal of the differential output to a negative terminal of the differential input of the ADC; a second capacitor coupled between a negative terminal of the differential output to a positive terminal of the differential input of the ADC; a successive approximation register (SAR) including a differential input coupled to the differential output of the operational amplifier, a first output configured to produce the first digital signal, and a second output configured to produce a clock with a frequency related to a sampling rate of the first digital signal; and a digital-to-analog converter (DAC) including an input coupled to a third output of the SAR, and a differential output coupled to the differential input of the operational amplifier.

Aspect 14: The apparatus of any one of aspects 1-13, further including a digital processing circuit including an input coupled to the output of the ADC, and an output configured to produce a second digital signal based on the first digital signal.

Aspect 15: The apparatus of aspect 14, wherein the digital processing circuit includes a decimation filter.

Aspect 16: The apparatus of aspect 15, wherein the decimation filter includes: a moving average circuit including first and second inputs coupled to the first and second outputs of the ADC, respectively; an accumulator including a first input coupled to an output of the moving average circuit and a second input coupled to the second input of the ADC; a counter including a first input coupled to the second output of the ADC and a second input configured to receive a delayed start/stop signal; and a divider including a first input coupled to an output of the accumulator, a second input coupled to an output of the counter, and an output configured to produce the second digital signal.

Aspect 17: The apparatus of aspect 16, wherein the decimation filter further includes a delay configured to generate the delayed start/stop signal based on a programmable length over which the moving average circuit averages the first digital signal.

Aspect 18: The apparatus of any one of aspects 14-17, wherein the digital processing circuit includes an offset cancellation circuit configured to modify the second digital signal based on a set of offsets associated with one or more of the set of power detectors, respectively.

Aspect 19: An apparatus, including: a set of power detectors configured to generate a set of analog signals related to a set of output signal power levels of a set of transmit chains of a transmitter, respectively; an analog summer; a first set of switching devices configured to send a selected one or more of the set of analog signals to the analog summer and substantially isolate unselected one or more of the set of power detectors from the analog summer, wherein the analog summer is configured to generate a cumulative analog signal based on a sum of the selected one or more of the set of analog signals; an analog-to-digital converter (ADC) configured to generate a first digital signal based on the cumulative analog signal; and a controller configured to control the first set of switching devices.

Aspect 20: The apparatus of aspect 19, wherein the analog summer includes a set of resistors coupled between the first set of switching devices and an input of the ADC, respectively.

Aspect 21: The apparatus of aspect 20, wherein the analog summer further includes a second set of switching devices coupled between the set of resistors and the input of the ADC, respectively.

Aspect 22: The apparatus of aspect 21, wherein the analog summer further includes a third set of switching devices coupled between the set of resistors and a reference voltage source, respectively.

Aspect 23: The apparatus of any one of aspects 19-22, wherein: the set of power detectors includes a set of differential outputs, respectively; the first set of switching devices includes a first subset of switching devices coupled to positive terminals of the set of differential outputs of the set of power detectors, respectively; and the first set of switching devices includes a second subset of switching devices coupled to negative terminals of the set of differential outputs of the set of power detectors, respectively.

Aspect 24: The apparatus of aspect 23, wherein the input of the ADC includes a differential input, and wherein the analog summer includes: a first resistor coupled between the first subset of switching devices and a first terminal of the differential input of the ADC; and a second resistor coupled between the second subset of switching devices and a second terminal of the differential input of the ADC.

Aspect 25: The apparatus of any one of aspects 19-24, wherein each of the first set of switching devices includes a set of throws for selectively coupling a corresponding first terminal to one or more second terminals of the first set of switching devices, respectively.

Aspect 26: The apparatus of aspect 25, wherein the controller, in a calibration mode, is configured to couple a selected one of the first terminal to a selected one or more of the second terminals of the first set of switching devices, and decouple an unselected one or more of the first terminal from any of the second terminals of the first set of switching devices.

Aspect 27: A method, including: generating a set of analog signals related to a set of output signal power levels of a set of transmit chains of a transmitter, respectively; summing a selected one or more of the set of analog signal to generate a cumulative analog signal; and digitizing the cumulative analog signal to generate a digital signal.

Aspect 28: The method of aspect 27, wherein generating the set of analog signals is performed in accordance with a measurement mode.

Aspect 29: The method of aspect 28, further including: generating a set of power detector offset voltages associated with the set of transmit chains of the transmitter in a time-multiplexed manner in a calibration mode, respectively; and digitizing the set of power detector offset voltages, wherein the digital signal is modified based on one or more of the set of digitized power detector offset voltages in measurement mode.

Aspect 30: An apparatus, including: means for generating a set of analog signals related to a set of output signal power levels of a set of transmit chains of a transmitter, respectively; means for summing a selected one or more of the set of analog signal to generate a cumulative analog signal; and means for digitizing the cumulative analog signal to generate a digital signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus comprising:
   a set of power detectors coupled to a set of transmit chains of a transmitter, respectively;
   an analog summer;
   a first set of switching devices coupled between the set of power detectors and an input of the analog summer, respectively; and
   an analog-to-digital converter (ADC) including an input coupled to an output of the analog summer, and an output configured to produce a first digital signal related to an output power of the transmitter.

2. The apparatus of claim 1, wherein the analog summer comprises a set of resistors coupled between the first set of switching devices and the input of the ADC, respectively.

3. The apparatus of claim 2, wherein the analog summer further comprises a second set of switching devices coupled between the set of resistors and the input of the ADC, respectively.

4. The apparatus of claim 3, wherein the analog summer further comprises a third set of switching devices coupled between the set of resistors and a reference voltage source, respectively.

5. The apparatus of claim 1, wherein:
   the set of power detectors include a set of differential outputs, respectively;
   the first set of switching devices includes a first subset of switching devices coupled to positive terminals of the set of differential outputs of the set of power detectors, respectively; and
   the first set of switching devices includes a second subset of switching devices coupled to negative terminals of the set of differential outputs of the set of power detectors, respectively.

6. The apparatus of claim 5, wherein the input of the ADC comprises a differential input, and wherein the analog summer comprises:
   a first resistor coupled between the first subset of switching devices and a first terminal of the differential input of the ADC; and
   a second resistor coupled between the second subset of switching devices and a second terminal of the differential input of the ADC.

7. The apparatus of claim 6, wherein the analog summer further comprises:
   a first switching device coupled between the first resistor and the first terminal of the ADC; and
   a second switching device coupled between the second resistor and the second terminal of the ADC.

8. The apparatus of claim 7, wherein the analog summer further comprises:
   a third switching device coupled between the first resistor and a reference voltage source; and
   a fourth switching device coupled between the second resistor and the reference voltage source.

9. The apparatus of claim 1, wherein each of the first set of switching devices comprises a set of throws for selectively coupling its first terminal to one or more second terminals of the first set of switching devices, respectively.

10. The apparatus of claim 1, wherein the first set of switching devices is part of a switch matrix, wherein each switching device of the first set includes an input terminal configured to selectively and simultaneously be coupled to one or more output terminals of the first set of switching devices, respectively.

11. The apparatus of claim 1, further comprising a controller coupled to a set of control inputs of the first set of switching devices, respectively.

12. The apparatus of claim 1, wherein the ADC comprises a successive approximation ADC.

13. The apparatus of claim 1, wherein the ADC comprises:
   an operational amplifier including a differential input and a differential output, wherein the input of the ADC includes the differential input;
   a first capacitor coupled between a positive terminal of the differential output to a negative terminal of the differential input of the ADC;
   a second capacitor coupled between a negative terminal of the differential output to a positive terminal of the differential input of the ADC;
   a successive approximation register (SAR) including a differential input coupled to the differential output of the operational amplifier, a first output configured to produce the first digital signal, and a second output configured to produce a clock with a frequency related to a sampling rate of the first digital signal; and
   a digital-to-analog converter (DAC) including an input coupled to a third output of the SAR, and a differential output coupled to the differential input of the operational amplifier.

14. The apparatus of claim 1, further comprising a digital processing circuit including an input coupled to the output of the ADC, and an output configured to produce a second digital signal based on the first digital signal.

15. The apparatus of claim 14, wherein the digital processing circuit comprises a decimation filter.

16. The apparatus of claim 15, wherein the output of the ADC is a first output, wherein the decimation filter comprises:
   a moving average circuit including first and second inputs coupled to the first output and a second output of the ADC, respectively;
   an accumulator including a first input coupled to an output of the moving average circuit and a second input coupled to the second output of the ADC;
   a counter including a first input coupled to the second output of the ADC and a second input configured to receive a delayed start/stop signal; and a divider including a first input coupled to an output of the accumulator, a second input coupled to an output of the counter, and an output configured to produce the second digital signal.

17. The apparatus of claim 16, wherein the decimation filter further comprises a delay configured to generate the delayed start/stop signal based on a programmable length over which the moving average circuit averages the first digital signal.

18. The apparatus of claim 14, wherein the digital processing circuit comprises an offset cancellation circuit configured to modify the second digital signal based on a set of offsets associated with one or more of the set of power detectors, respectively.

19. An apparatus comprising:
a set of power detectors configured to generate a set of analog signals related to a set of output signal power levels of a set of transmit chains of a transmitter, respectively;
an analog summer;
a first set of switching devices configured to send a selected one or more of the set of analog signals to the analog summer and isolate unselected one or more of the set of power detectors from the analog summer, wherein the analog summer is configured to generate a cumulative analog signal based on a sum of the selected one or more of the set of analog signals;
an analog-to-digital converter (ADC) configured to generate a first digital signal based on the cumulative analog signal; and
a controller configured to control the first set of switching devices.

20. The apparatus of claim 19, wherein the analog summer comprises a set of resistors coupled between the first set of switching devices and an input of the ADC, respectively.

21. The apparatus of claim 20, wherein the analog summer further comprises a second set of switching devices coupled between the set of resistors and the input of the ADC, respectively.

22. The apparatus of claim 21, wherein the analog summer further comprises a third set of switching devices coupled between the set of resistors and a reference voltage source, respectively.

23. The apparatus of claim 19, wherein:
the set of power detectors includes a set of differential outputs, respectively;
the first set of switching devices includes a first subset of switching devices coupled to positive terminals of the set of differential outputs of the set of power detectors, respectively; and
the first set of switching devices includes a second subset of switching devices coupled to negative terminals of the set of differential outputs of the set of power detectors, respectively.

24. The apparatus of claim 23, wherein the input of the ADC comprises a differential input, and wherein the analog summer comprises:
a first resistor coupled between the first subset of switching devices and a first terminal of the differential input of the ADC; and
a second resistor coupled between the second subset of switching devices and a second terminal of the differential input of the ADC.

25. The apparatus of claim 19, wherein each of the first set of switching devices comprises a set of throws for selectively coupling a corresponding first terminal to one or more second terminals of the first set of switching devices, respectively.

26. The apparatus of claim 25, wherein the controller, in a calibration mode, is configured to couple a selected one of the first terminal to a selected one or more of the second terminals of the first set of switching devices, and decouple an unselected one or more of the first terminal from any of the second terminals of the first set of switching devices.

27. A method comprising:
generating a set of analog signals related to a set of output signal power levels of a set of transmit chains of a transmitter, respectively;
summing a selected one or more of the set of analog signals to generate a cumulative analog signal; and
digitizing the cumulative analog signal to generate a digital signal.

28. The method of claim 27, wherein generating the set of analog signals is performed in accordance with a measurement mode.

29. The method of claim 28, further comprising:
generating a set of power detector offset voltages associated with the set of transmit chains of the transmitter in a time-multiplexed manner in a calibration mode, respectively; and
digitizing the set of power detector offset voltages, wherein the digital signal is modified based on one or more of the set of digitized power detector offset voltages in measurement mode.

30. An apparatus comprising:
means for generating a set of analog signals related to a set of output signal power levels of a set of transmit chains of a transmitter, respectively;
means for summing a selected one or more of the set of analog signals to generate a cumulative analog signal; and
means for digitizing the cumulative analog signal to generate a digital signal.

* * * * *